(12) United States Patent
Toda

(10) Patent No.: US 6,772,278 B2
(45) Date of Patent: Aug. 3, 2004

(54) DATA TRANSFER SYSTEM AND DATA TRANSFER METHOD

(75) Inventor: Haruki Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 292 days.

(21) Appl. No.: 10/015,425

(22) Filed: Dec. 12, 2001

(65) Prior Publication Data

US 2002/0103962 A1 Aug. 1, 2002

Related U.S. Application Data

(63) Continuation of application No. 08/861,232, filed on May 21, 1997, now Pat. No. 6,363,465.

(30) Foreign Application Priority Data

Nov. 25, 1996 (JP) .............................................. 8-313438

(51) Int. Cl.[7] .............................................. G06F 12/00
(52) U.S. Cl. ...................... 711/105; 711/169; 711/167; 365/189.04; 365/194; 365/233
(58) Field of Search ................................. 711/169, 167, 711/154, 105, 100; 365/189.04, 169, 194, 233, 230.04, 230.09, 220, 230.01; 327/99, 293, 298

(56) References Cited

U.S. PATENT DOCUMENTS

| 5,237,565 A | * | 8/1993 | Henrion et al. ............. 370/236 |
| 5,313,437 A | | 5/1994 | Toda et al. .................. 365/236 |
| 5,369,618 A | * | 11/1994 | Takasugi ................ 365/230.01 |
| 5,392,254 A | | 2/1995 | Toda ........................... 365/240 |
| 5,412,615 A | | 5/1995 | Noro et al. .................. 365/233 |
| 5,534,805 A | * | 7/1996 | Miyazaki et al. ........... 327/144 |
| 5,703,507 A | * | 12/1997 | Siebert ......................... 327/99 |
| 5,706,459 A | | 1/1998 | Atsushi ....................... 712/200 |
| 5,740,115 A | | 4/1998 | Ishibashi et al. ............ 365/203 |
| 5,764,584 A | | 6/1998 | Fukiage et al. ........ 365/230.03 |
| 5,764,590 A | | 6/1998 | Iwamoto et al. ....... 365/230.03 |
| 5,774,702 A | | 6/1998 | Mitsuishi et al. ........... 713/501 |
| 5,793,944 A | | 8/1998 | Luick .......................... 714/15 |
| 5,802,596 A | | 9/1998 | Shinozaki .................... 711/169 |
| 5,815,462 A | | 9/1998 | Konishi et al. ............. 365/233 |
| 5,818,793 A | | 10/1998 | Toda et al. .................. 365/233 |
| 5,835,443 A | | 11/1998 | Fujita .......................... 365/233 |
| 5,901,190 A | | 5/1999 | Lee .............................. 375/373 |
| 5,990,714 A | | 11/1999 | Takahashi ................... 365/233 |
| 6,230,245 B1 | | 5/2001 | Manning .................... 711/167 |
| 6,633,995 B1 | * | 10/2003 | Nam .......................... 713/600 |

FOREIGN PATENT DOCUMENTS

| EP | 3331 043 | * | 3/1984 | ............. H04J/3/02 |
| EP | 000978968 A2 | * | 2/2000 | ........... H04L/12/56 |

OTHER PUBLICATIONS

Hoi–Jun Yoo, "A Study of Pipeline Architectures for High–Speed Synchronous DRAMs", IEEE Journal of Solid–State Circuits, vol.: 32, pp. 1597–1603, Oct. 1997.

* cited by examiner

Primary Examiner—Pierre Bataille
(74) Attorney, Agent, or Firm—Hogan & Hartson, LLP

(57) ABSTRACT

A semiconductor device comprises an internal circuit and a clock signal switching unit group having M clock signal switching units. m first clock signals and n control signals are input to the clock signal switching unit group (M is not less than m, and M is not less than n). Each of the M clock signal switching units, to which one of the m first clock signals, and an output clock signal from another clock signal switching unit are input, selects one of the m first clock signal and a signal obtained by delaying the output clock signal from another clock signal switching unit, based on the n control signals, and outputs the selected one of the m first clock signal and the signal as an output clock signal. The output clock signal controls the internal circuit.

24 Claims, 18 Drawing Sheets

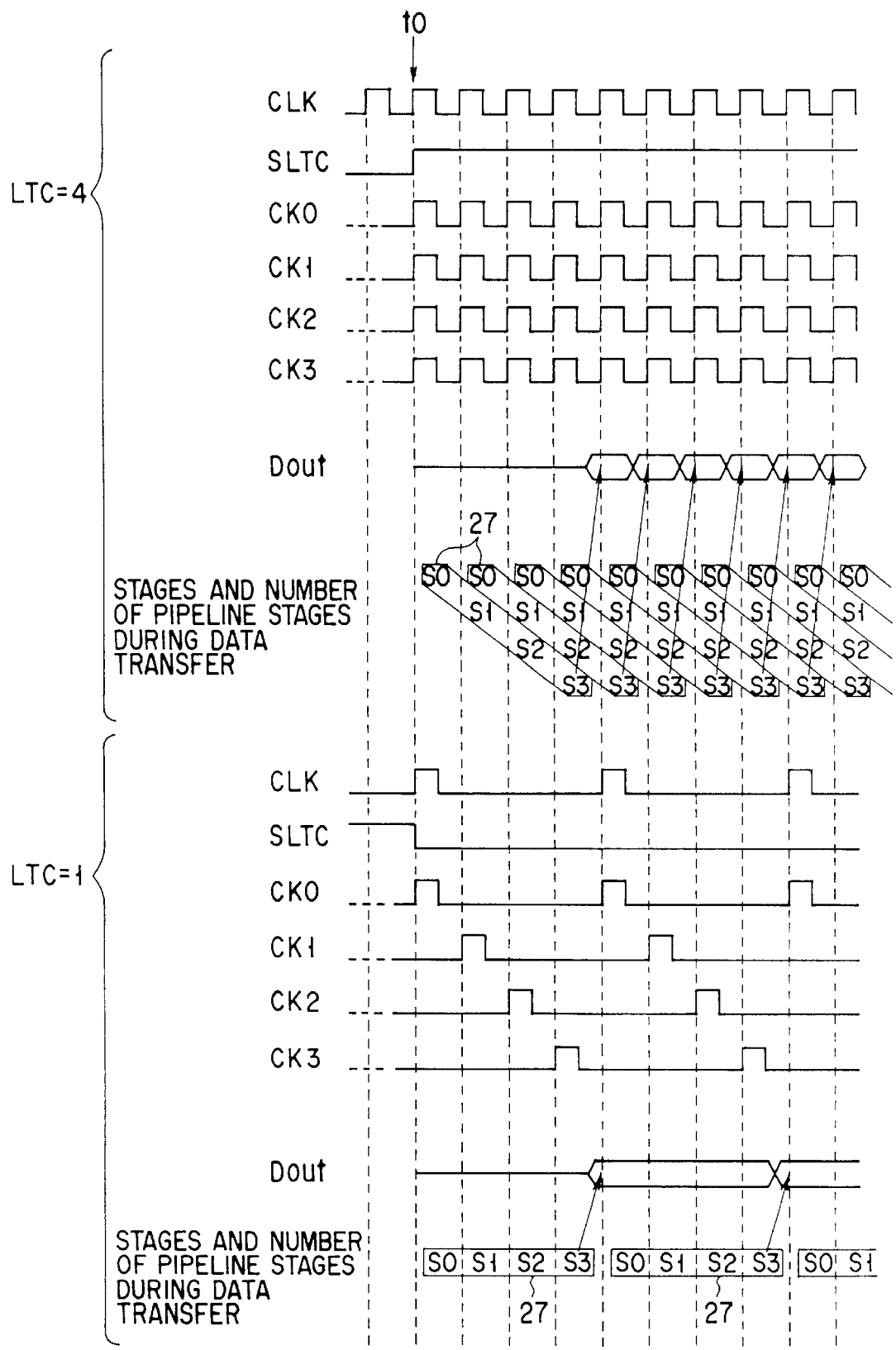
F I G. 1

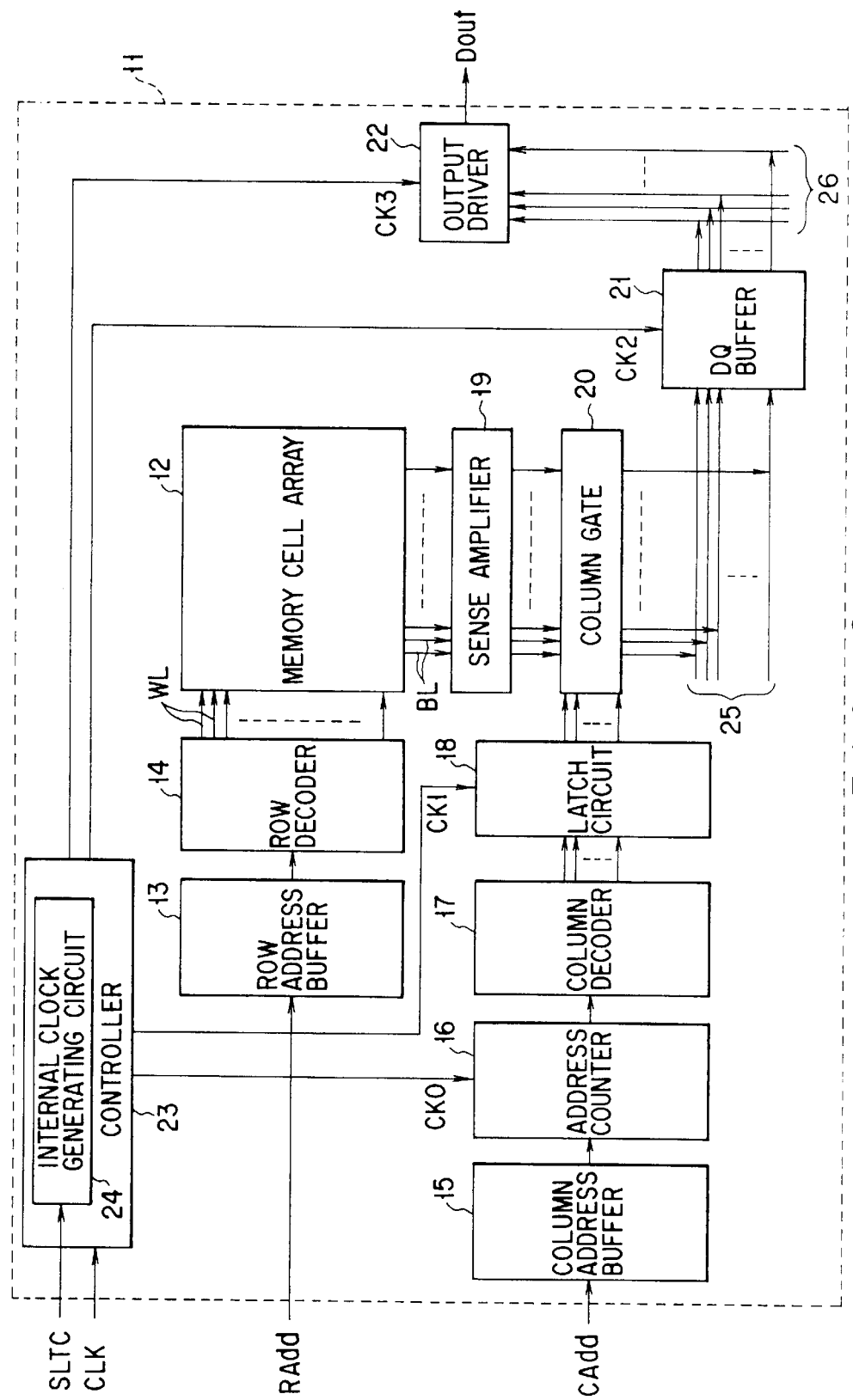
F I G. 2

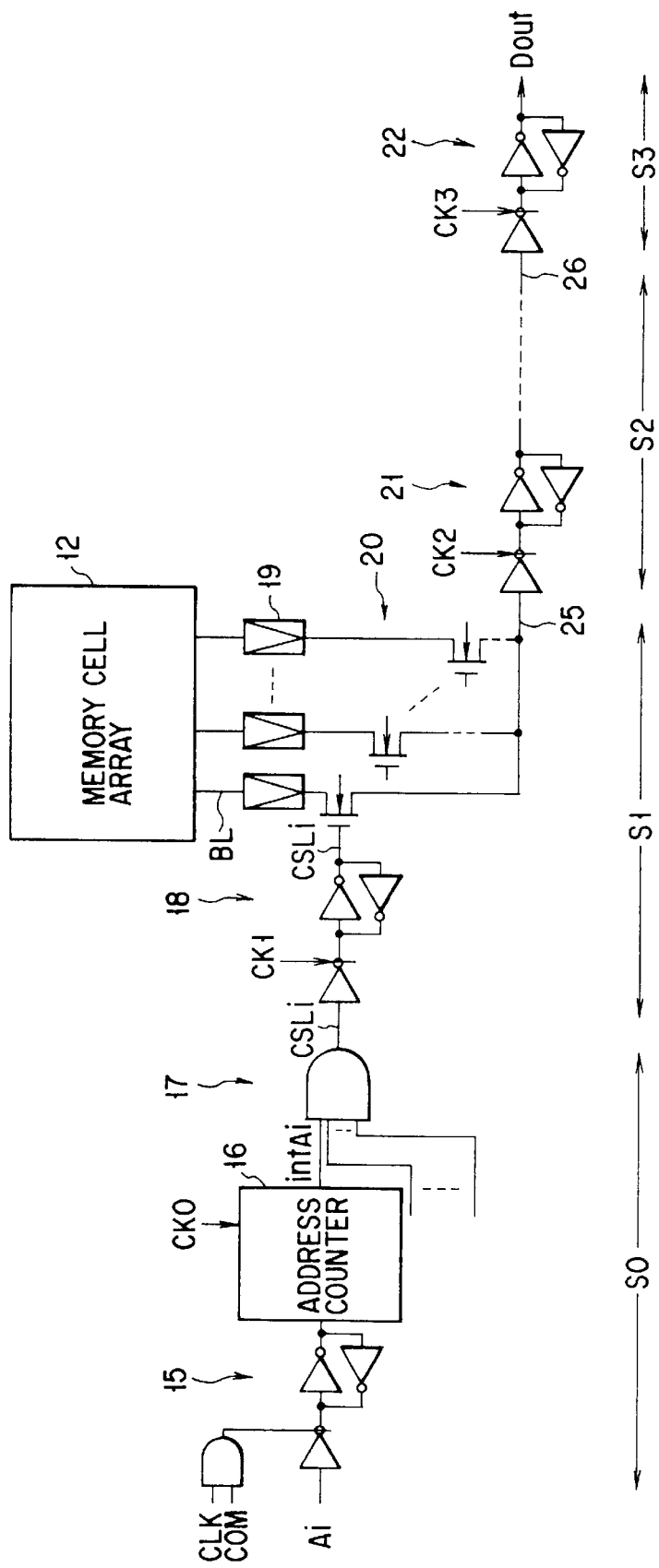
F I G. 3

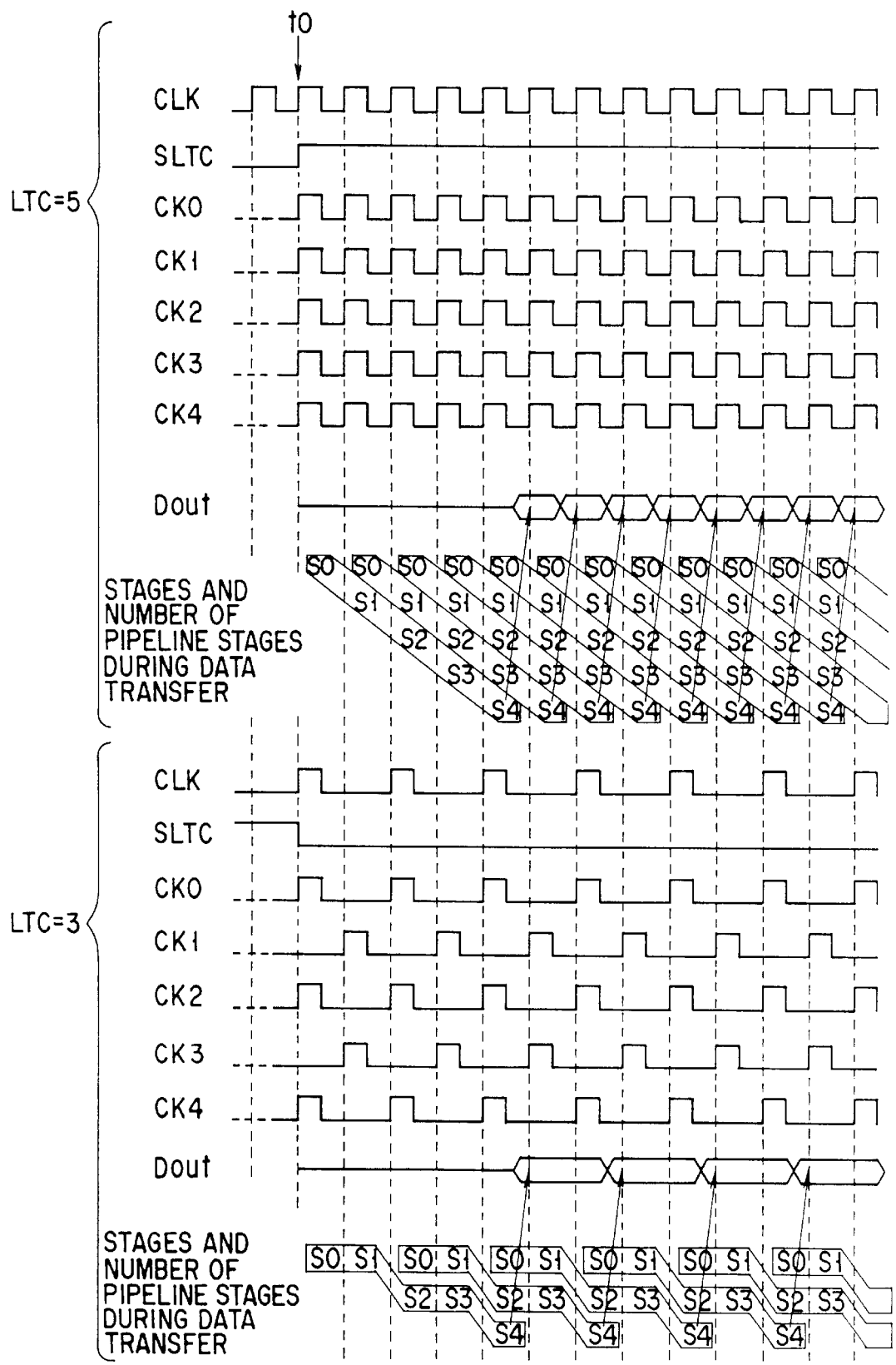
F I G. 7

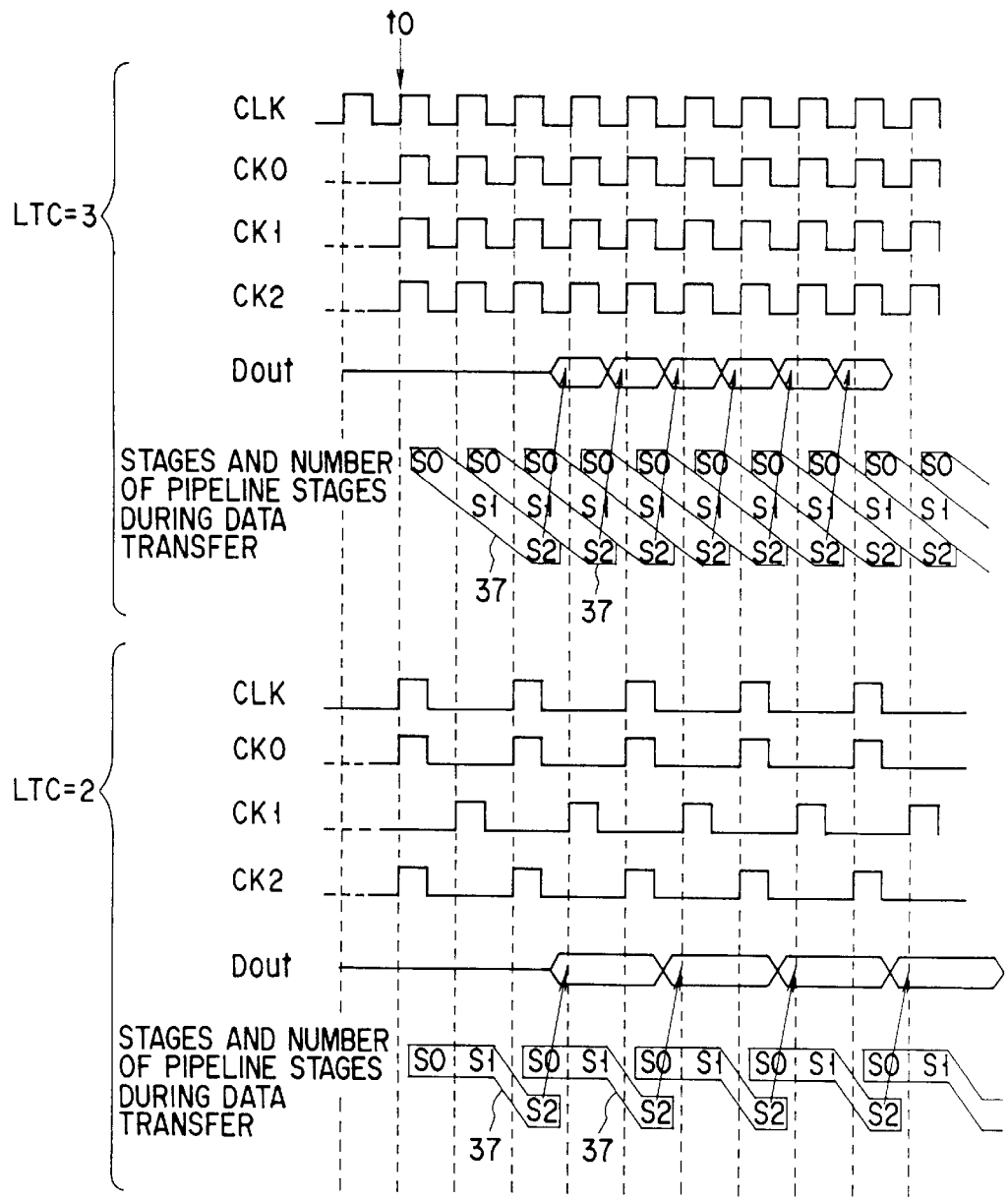
F I G. 12

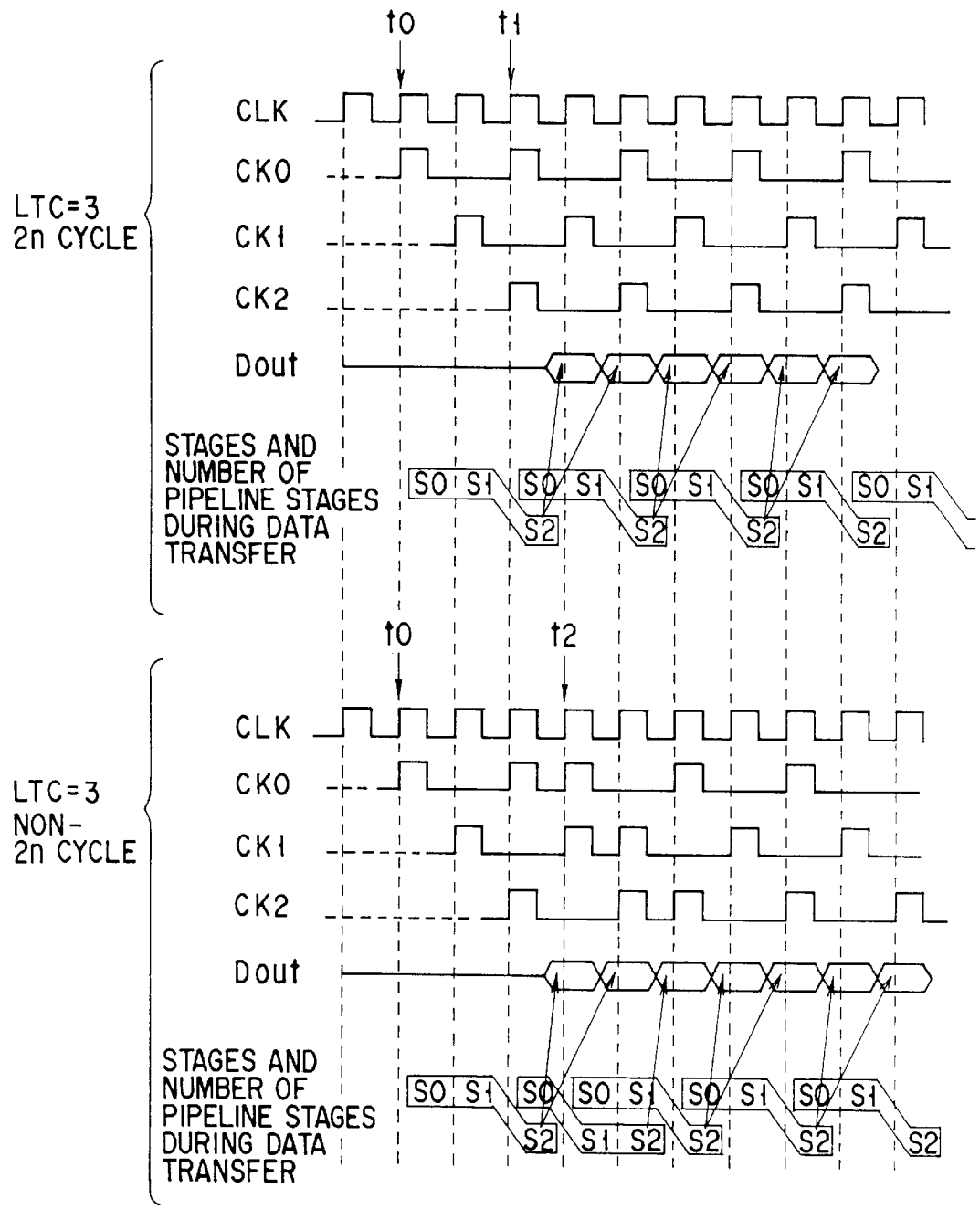
F I G. 13

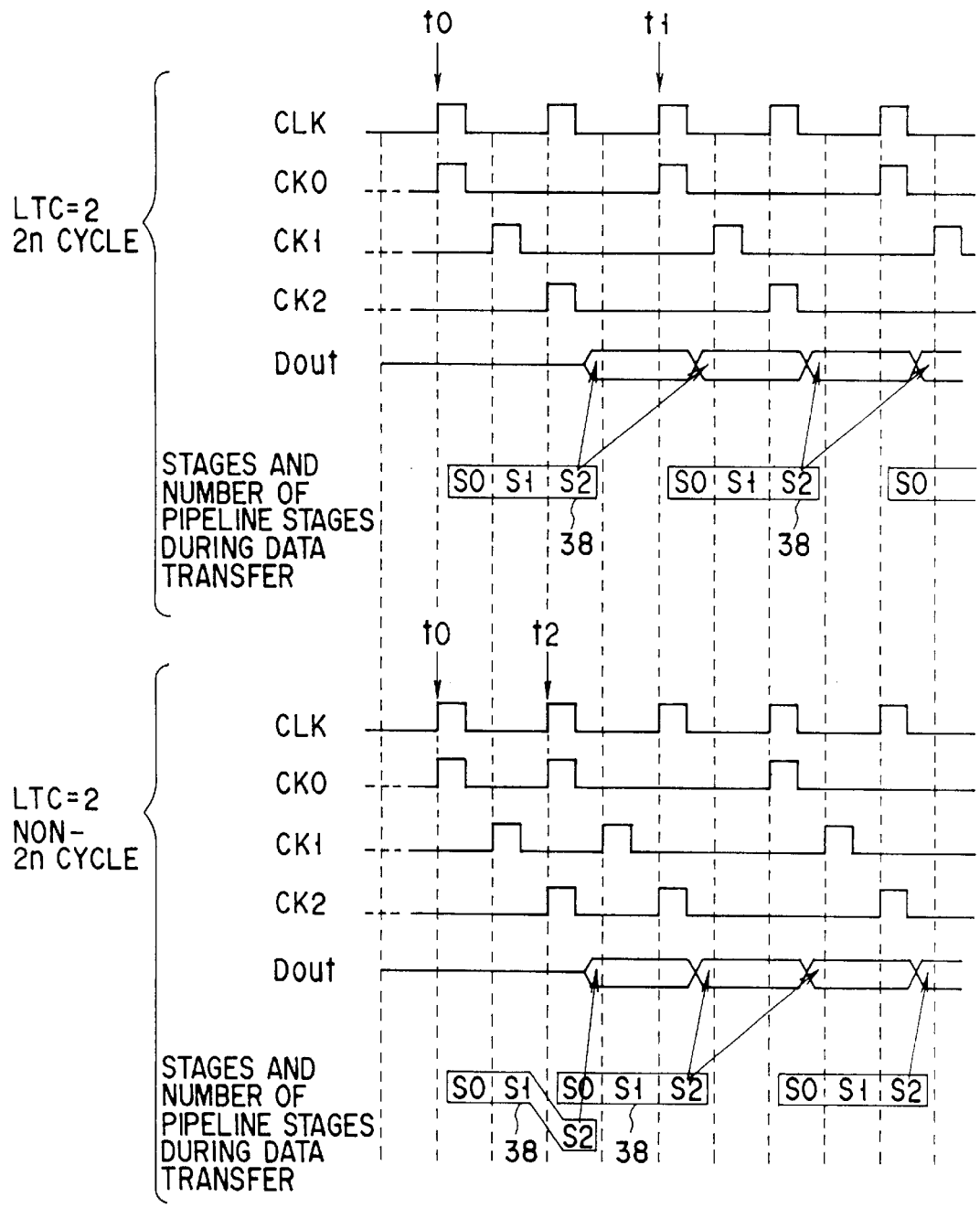
F I G. 14

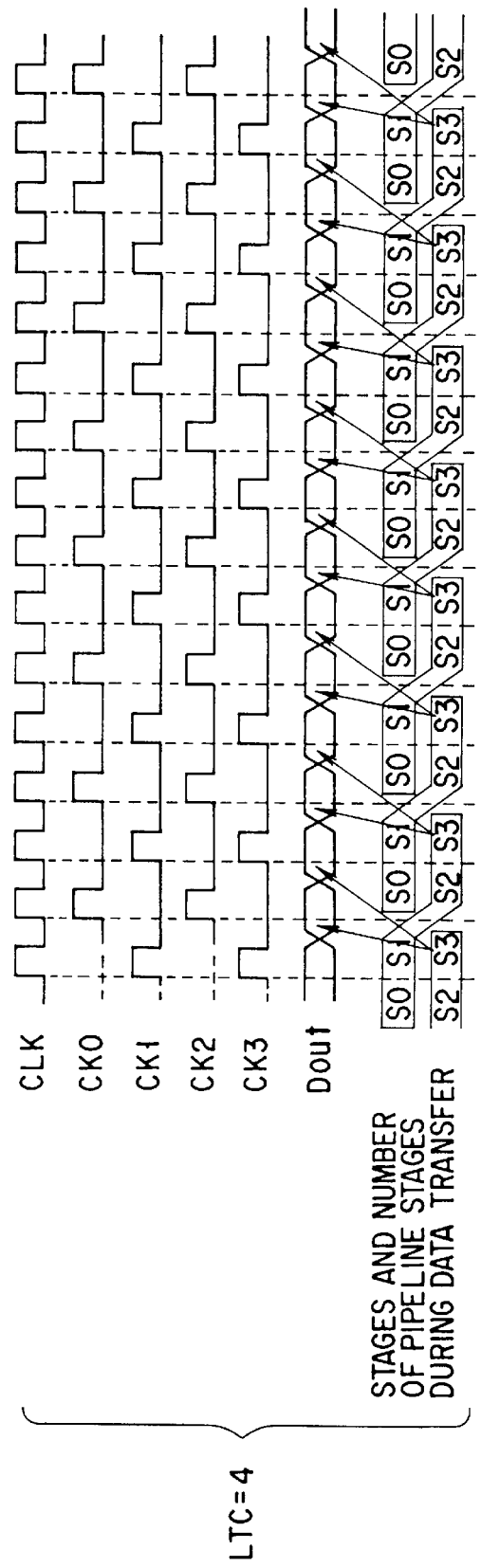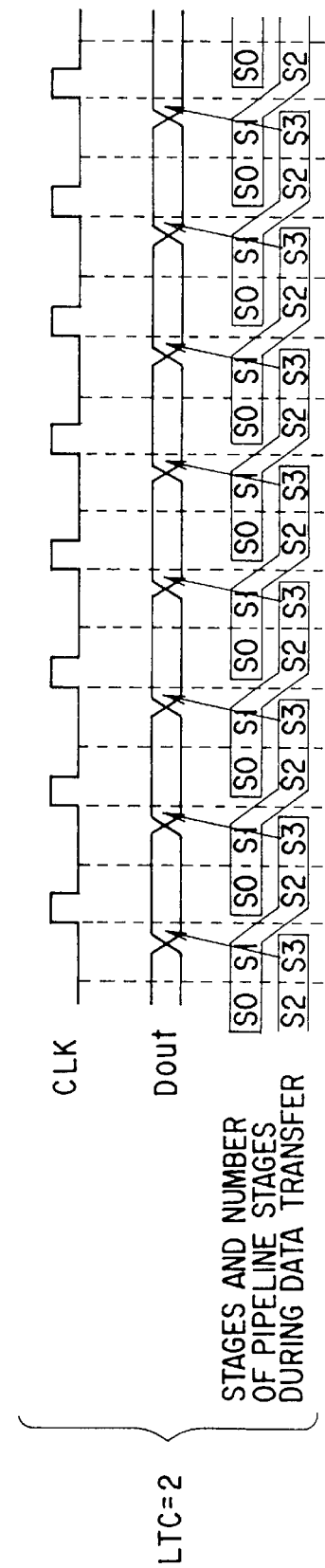

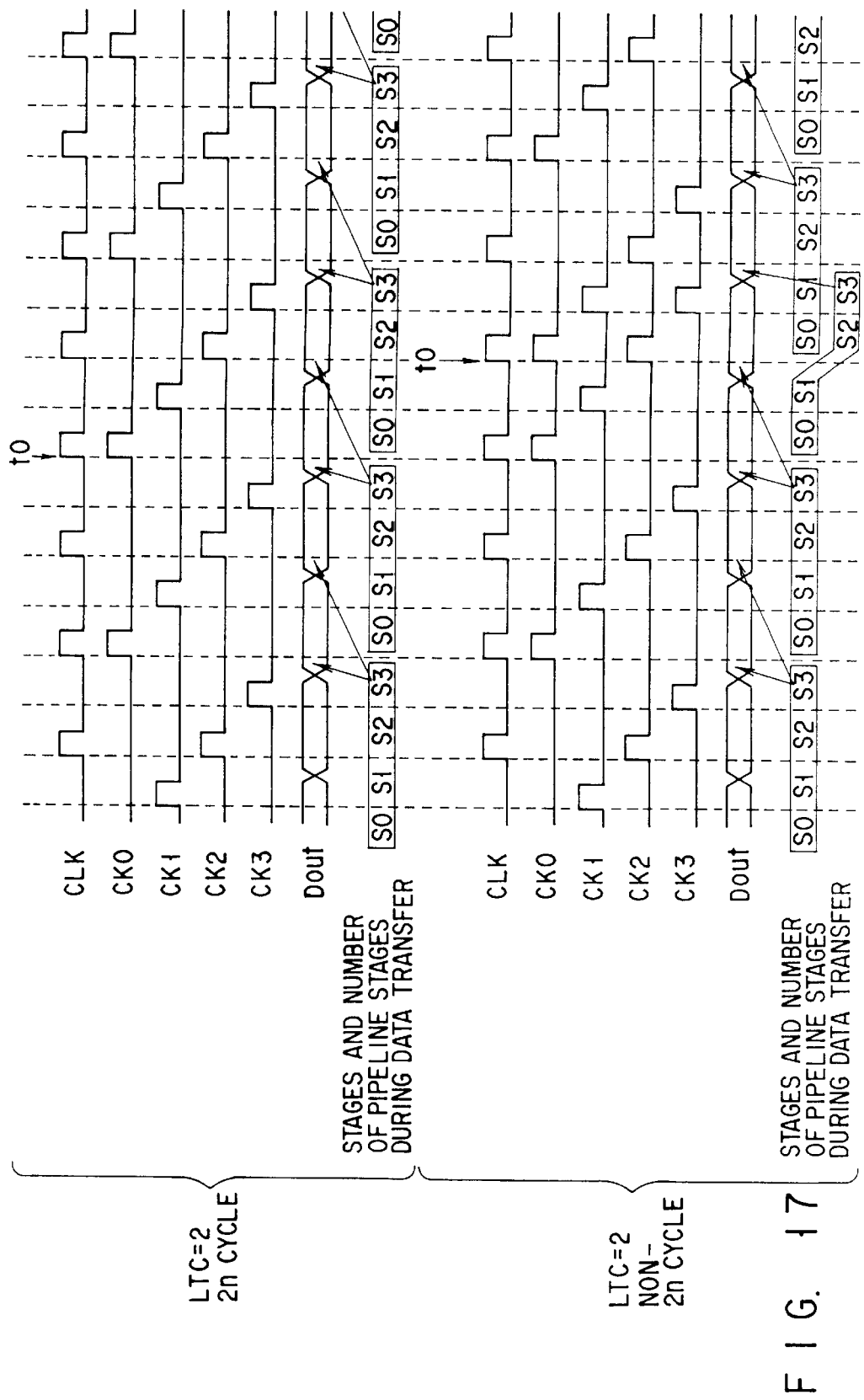
F I G. 17

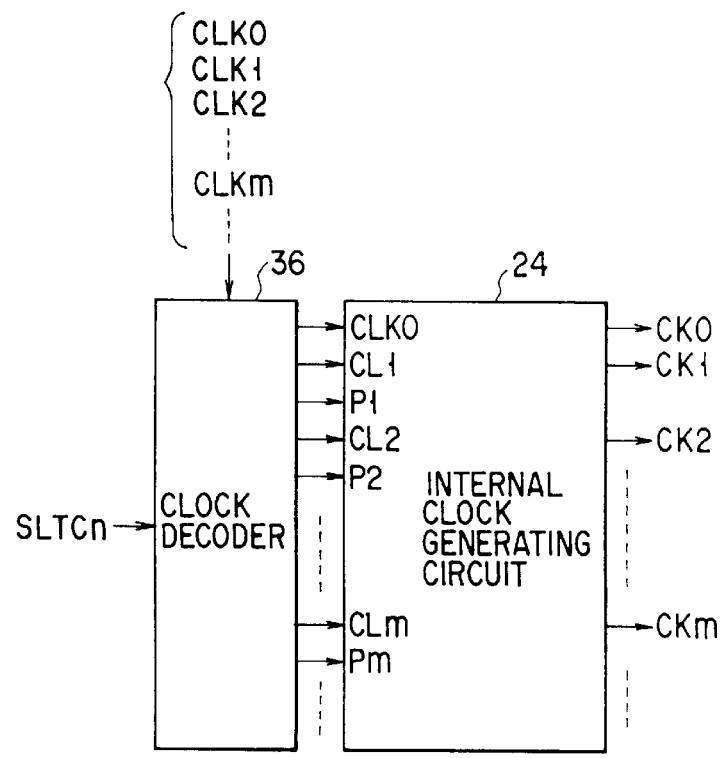
F I G. 20
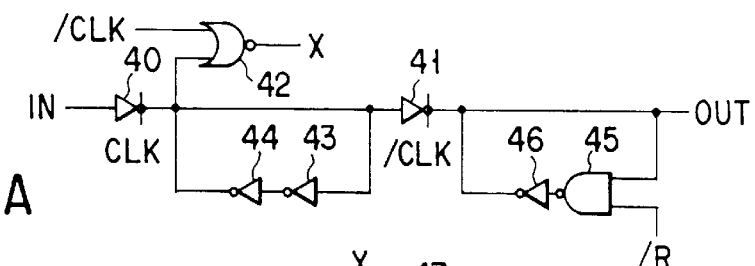
F I G. 21A
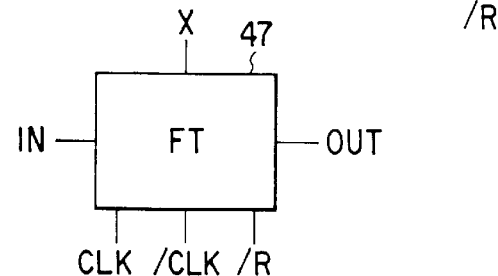
F I G. 21B
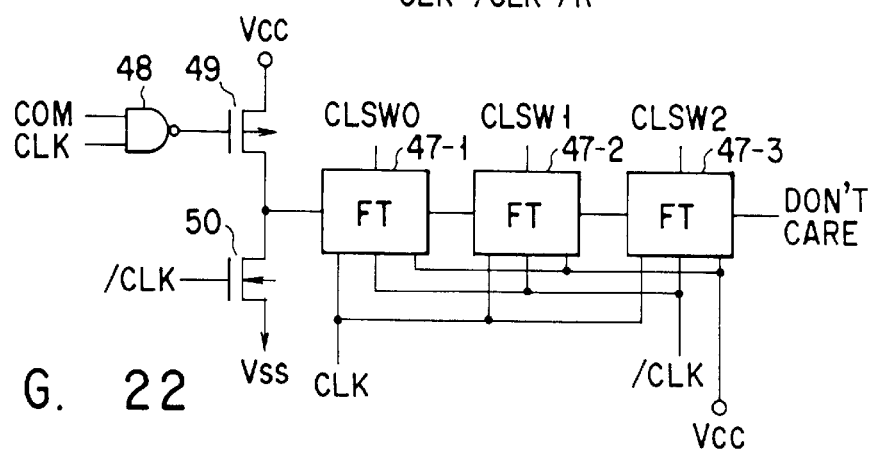
F I G. 22

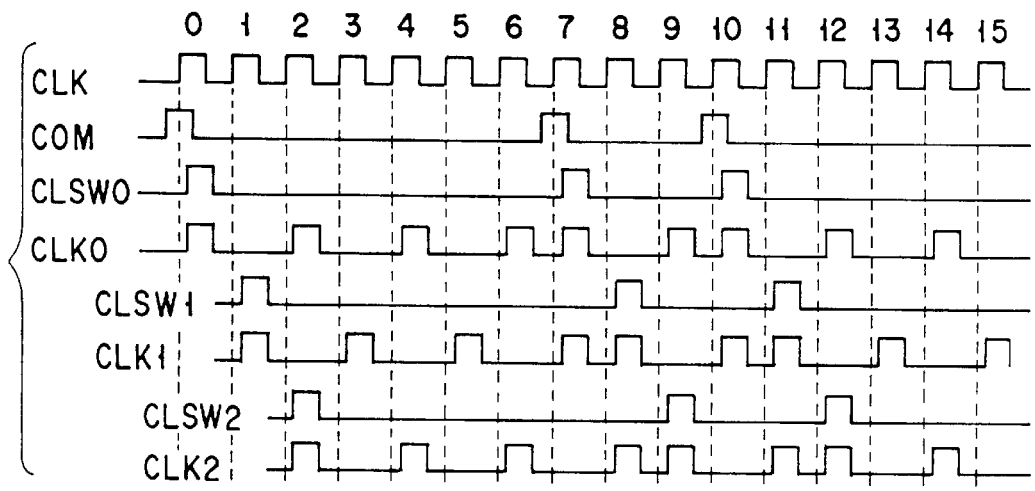
F I G. 25
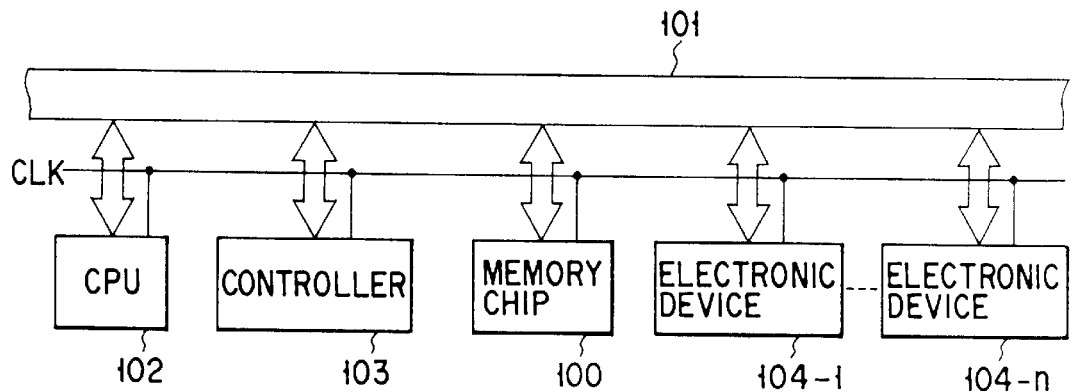
F I G. 26

DATA TRANSFER SYSTEM AND DATA TRANSFER METHOD

This is a continuation of application Ser. No. 08/861,232 filed May 21, 1997 now U.S. Pat. No. 6,363,465.

BACKGROUND OF THE INVENTION

The present invention relates to a synchronous semiconductor memory device utilizing the latency technique, and more specifically to a data transfer system and data transfer method for transferring data through multiple data transfer stages under pipeline control.

Recently, there has been put into practical use semiconductor memory devices, such as synchronous dynamic random access memories ("SDRAMs"), in which data transfer control is simplified and high-speed data transfer is attained by synchronizing the control process with a clock signal. In the conventional SDRAM, a latency technique is used to enhance the clock frequency by masking (or apparently disregarding) the time required to output data from the memory cell to the exterior of the device. The latency indicates the minimum number of cycles required from the cycle in which an address is fetched to the cycle in which the data specified by the address is output. Such conventional SDRAMs are disclosed in Japanese Patent Application KOKAI Publication No. 5-2873 (corresponding to U.S. Pat. No. 5,313,437) and Japanese Patent Application KOKAI Publication No. 6-76563 (corresponding to U.S. Pat. No. 5,392,254).

FIG. 27 shows the relation between an external clock signal CLK and data output Dout in one case where the latency is "4" (LTC=4) and another case where the latency is "1" (LTC=1). If access is started at the rise of the clock at t0, the data transfer time T required for outputting the first data item of a series of data items is the same regardless of the latency because the data transfer time is determined by the characteristics of the memory device itself. If the latency is increased and the memory is controlled by a clock of constant period, more cycles are allotted to the data transfer time so that the clock period can be shortened and a high-frequency clock can be used to output the data. With a high-frequency clock, memory access and data transfer can be performed at a high speed in synchronism with the high-frequency clock, and the amount of data output per time unit can be increased, as can be understood from FIG. 27.

When the latency is "1", the data transfer operation from the rise of the external clock signal CLK to the output of data can be performed as a sequence of operations. On the other hand, when the latency is "4", a plurality of data items are present in the same data transfer path, so a method for simultaneously transferring the data items in one block or a pipeline method for transferring the data must be used. In the pipeline method, the data transfer path is divided into segments, the data items in the segments are simultaneously transferred to construct a pipeline stage, and then the data is shifted between segments in a time sharing fashion. Because it is not necessary to previously determine the data block in the pipeline method, the data to be transferred can be freely selected for each clock cycle. However, if the latency is changed when the pipeline method is being used to transfer the data, the following problem occurs.

When a memory device using the pipeline method and having a latency of "4" is changed from a high-frequency clock to a low-frequency clock, the apparent data transfer time is made longer if the latency is not changed. But, if the latency is changed from "4" to "1", the number of stages in the data transfer pipeline must be changed so as to complete the data transfer in the cycle of the latency. Thus, the number of stages in the pipeline must be changed for each change in the latency. However, in order to change the number of pipeline stages, drastic changes must be made in the circuit construction and operation timing of the memory device. Thus, for each latency to be selectively used, pipeline control and operation timing for that latency must be designed into the device, so the data transfer system and the semiconductor memory device become complicated. Furthermore, the system must be redesigned to allow a latency other than the latencies already designed into the device to be used, so it is extremely difficult to flexibly cope with various latency requirements.

As explained above, in the conventional synchronous memory device using the pipeline-type data transfer system, the number of pipeline stages must be changed each time the latency is changed, and this requires drastic changes in the circuit construction and operation timing of the device. Further, in the conventional synchronous memory device using the latency technique, in order to use a latency other than the latencies already designed into the device, the memory device must be re-designed so it is extremely difficult to provide a device that can flexibly satisfy various latency requirements.

BRIEF SUMMARY OF THE INVENTION

According to an aspect of the present invention, there is provided a semiconductor device comprising an internal circuit; and a clock signal switching unit group having M clock signal switching units, the M clock signal switching units being connected in series, and an output clock signal from a clock signal switching unit of a preceding stage being input to a clock signal switching unit of a succeeding stage, m first clock signals and n control signals being input to the clock signal switching unit group (M is not less than m, and M is not less than n), each of the M clock signal switching units, to which one of the m first clock signals, and an output clock signal from a preceding stage are input, selecting either the m first clock signal or a signal obtained by delaying the output clock signal from the preceding stage, based on the n control signals, and outputting the selected one of the m first clock signal and the signal as an output clock signal, and the output clock signal controlling the internal circuit.

According to another aspect of the invention, there is provided a semiconductor device comprising an internal circuit; and a clock signal switching unit group having a plurality of clock signal switching units, the plurality of clock signal switching units being connected in series, and an output clock signal from a clock signal switching unit of a preceding stage being input to a clock signal switching unit of a succeeding stage, each of the clock signal switching units, to which a first clock signal, a control signal, and an output clock signal from a preceding stage are input, selecting one of the first clock signal and a signal obtained by delaying the output clock signal from the preceding stage, based on the control signal, and outputting the selected one of the first clock signal and the signal as an output clock signal, and the output clock signal controlling the internal circuit.

To achieve this object, a first preferred embodiment of the present invention provides a data transfer system that includes a system having successive stages connected in series. Each of the stages performs a partial operation necessary for transferring data in synchronism with a control clock, and the system transfers data by sequentially operating the stages and performs pipeline control to allow two or more stages to simultaneously transfer data. Also included is a clock generating circuit for generating internal clock signals based on an external clock signal supplied to the system, and a clock switching circuit for selectively switching the external clock signal and the internal clock signals generated by the clock generating circuit to control the operation of each of the stages.

In one embodiment, the clock generating circuit generates the internal clock signals based on a latency of the system, with the latency indicating the number of external clock cycles from the start of data access to data output. Further, the clock generating circuit generates the internal clock signals by sequentially delaying the external clock signal.

In another embodiment, there is a first mode in which all of the stages are controlled by the external clock signal, and a second mode in which only a first stage of the successive stages is controlled by the external clock signal and the other stages are controlled by the internal clock signals generated by the clock generating circuit.

In yet another embodiment, there is a mode in which a first stage and at least one intermediate stage of the successive stages are controlled by the external clock signal, and the other stages are controlled by the internal clock signals generated by the clock generating circuit.

Because the clock generating circuit generates the internal clock signals based on the external clock signal and the clock switching circuit selectively switches the external clock signal and the internal clock signals to change the clock signals that control the stages so as to change the latency, it becomes possible to easily cope with a change in the latency without having to change the number of data transfer segments or the control of the individual data transfer stages. Additionally, if the internal clock signals are generated based on the latency of the system, it becomes possible to easily generate the internal clock signals corresponding to that latency. And if the internal clock signals are generated by sequentially delaying the external clock signal, it becomes possible to more easily generate the internal clock signals and to prevent the internal clock signals from overlapping each other. Further, if all of the stages are controlled by the external clock signal, a latency which is equal to the number of stages is obtained, and if only the first stage is controlled by the external clock signal and the other stages are controlled by the internal clock signals, the latency becomes "1".

According to a second preferred embodiment of the present invention, a data transfer system is provided that includes a system having a plurality of successive stages connected in series. Each of the stages performs a partial operation necessary for transferring data in synchronism with a control clock, the system transfers data by sequentially operating the stages and performs pipeline control to allow two or more stages to simultaneously transfer data, and each stage transfers one data item at a time or simultaneously transfers two or more data items at a time as a block of data. Also provided is a clock generating circuit that generates internal clock signals based on an external clock signal and a series of paths, and supplies the internal clock signals to the system to control the operation of the stages, and path switching circuit that selectively switches the paths of the clock generating circuit so that the internal clock signals are generated in response to an external control signal.

In one embodiment the paths of the clock generating circuit are selected based on a selected latency for the system, with the latency indicating the number of external clock cycles from the start of data access to data output. Additionally, the clock generating circuit generates one internal clock signal from the external clock signal based on the number of stages and the number of data items to be transferred at a time, and generates a plurality of other internal clock signals based on the one internal clock via the series of paths.

In the second preferred embodiment, the internal clock signals can be generated based on the external clock signal by the clock generating circuit, and the external clock signal and the internal clock signals can be selectively switched as a control signal supplied to each stage of the system by the clock switching circuit. Therefore, it becomes possible to provide a pipeline-type data transfer system that can easily cope with a change of latency, without having to change the number of data transfer segments or the control of the individual data transfer stages. Additionally, the internal clock signals corresponding to the selected latency can be easily generated by selecting paths for generating the internal clock signals based on the selected latency. Further, if one internal clock is generated and then a plurality of internal clock signals are generated based on the one internal clock via a series of paths, a plurality of internal clock signals can be easily generated.

A third preferred embodiment of the present invention provides a data transfer method in which internal clock signals are generated based on an external clock signal that is supplied to a system having a plurality of successive stages connected in series, with each of the stages performing a partial operation necessary for transferring data in synchronism with a control clock. The external clock signal and the internal clock signals are selectively supplied to the successive stages to transfer data by sequentially operating the stages and to perform pipeline control to allow two or more of the stages to simultaneously transfer data, and the number of pipeline stages is changed by selectively changing the timings of at least one of the external clock signal and the internal clock signals that control the operation of the stages.

In one embodiment, the internal clock signals are generated based on a selected latency for the system, with the latency indicating the number of external clock cycles from the start of data access to data output. Further, the internal clock signals are generated by sequentially delaying the external clock signal.

Another embodiment provides a first mode in which all of the successive stages are controlled by the external clock signal, and a second mode in which only a first stage of the successive stages is controlled by the external clock signal and the other stages are controlled by the internal clock signals.

Yet another embodiment provides a mode in which a first stage and at least one intermediate stage of the successive stages are controlled by the external clock signal, and the other stages are controlled by the internal clock signals.

Because the number of pipeline stages is changed by generating internal clock signals based on the external clock signal and selectively switching the external clock signal and the internal clock signals to control the operation of each stage, it is possible to provide a pipeline-type data transfer method that can easily cope with a change of latency, without having to change the number of data transfer segments or the control of the individual data transfer stages.

Additionally, if the internal clock signals are generated based on the external clock signal according to the selected latency, the internal clock signals corresponding to the selected latency can be easily generated. And if the internal clock signals are generated by sequentially delaying the external clock signal, the internal clock signals corresponding to the selected latency can be more easily generated and prevented from overlapping each other. Further, if all of the stages are controlled by the external clock signal, a latency equal to the number of pipeline stages is obtained, and if only the first stage is controlled by the external clock signal and the other stages are controlled by the internal clock signals, the latency becomes "1".

A fourth preferred embodiment of the present invention provides a data transfer method in which internal clock signals are generated based on an external clock signal which is supplied to a system having a plurality of successive stages connected in series, with each of the stages performing a partial operation necessary for transferring data in synchronism with a control clock. The internal clock signals are selectively supplied to the successive stages to transfer data by sequentially operating the stages and to perform pipeline control to allow two or more of the stages to simultaneously transfer data, with each stage transferring one data item at a time or simultaneously transferring two or more data items at a time as a block of data. Additionally, the number of pipeline stages is changed by selectively changing the timings of the internal clock signals in response to an external control signal.

In one embodiment, the internal clock signals are generated based on a selected latency, with the latency indicating the number of external clock cycles from the start of data access to data output. Additionally, one internal clock signal is generated from the external clock signal based on the number of stages and the number of data items to be transferred at one time, and a plurality of other internal clock signals are generated based on the one internal clock signal.

In the fourth preferred embodiment, the internal clock signals can be generated based on the external clock signal and the internal clock signals can be selectively switched in response to a control signal. Therefore, it is possible to provide a pipeline-type data transfer method that can easily cope with a change of latency without having to change the number of data transfer segments or the control of the individual data transfer stages. Additionally, if the internal clock signals are generated based on the selected latency, the internal clock signals corresponding to the selected latency can be easily generated. And if one internal clock is generated according to the external clock signal and then a plurality of internal clock signals are generated based on the one internal clock, the internal clock signals corresponding to the selected latency can be more easily generated.

A fifth preferred embodiment of the present invention provides a semiconductor memory device that includes four stages, a controller, and a switching circuit. The first stage includes an address generating circuit that fetches a top address of a data burst and generates a sequence of addresses based on the top address, and a column decoder that decodes the address generated by the address generating circuit and generates a selection signal for a sense amplifier. The second stage latches the selection signal and couples the selected sense amplifier to a data transfer line to transfer data. The third stage includes a DQ buffer that senses and latches the data transferred to the data transfer line, with the data latched by the DQ buffer being supplied to an output driver. The fourth stage latches the data supplied to the output driver and outputs the data to the exterior of the memory device. The controller includes a clock generating circuit that generates internal clock signals based on an external clock signal, with the external clock signal and internal clock signals being selectively supplied to the first to fourth stages to control the stages in a pipeline fashion. Additionally, the switching circuit changes the number of pipeline stages by selectively switching the external clock signal and the internal clock signals to change the operation of the stages.

In one embodiment, the clock generating circuit generates the internal clock signals from the external clock signal based on a selected latency for the device by sequentially delaying the external clock signal.

In the fifth preferred embodiment, the number of pipeline stages can be switched according to the selected latency by controlling the first to fourth stages in a pipeline fashion by use of the controller and selectively switching the external clock signal and the internal clock signals to change the operation of the stages. Therefore, it is possible to provide a synchronous-type semiconductor memory device that can cope with a latency other than the latencies previously taken into consideration to flexibly cope with various latency requirements. Further, if the internal clock signals are generated based on the selected latency, the internal clock signals corresponding to the selected latency can be easily generated. And if the internal clock signals are generated by sequentially delaying the external clock signal, the internal clock signals corresponding to the selected latency can be more easily generated and prevented from overlapping each other.

A sixth preferred embodiment of the present invention provides a semiconductor memory device that includes four stages, a controller, and a switching circuit. The first stage includes an address generating circuit that fetches a top address of a data burst and generates a sequence of addresses based on the top address, and a column decoder that decodes the address generated by the address generating circuit and generates a selection signal for a sense amplifier. The second stage latches the selection signal and couples the selected sense amplifier to a data transfer line to transfer data, and the third stage includes a DQ buffer that senses and latches the data transferred to the data transfer line. The data latched by the DQ buffer is supplied to an output driver, and the fourth stage latches the data supplied to the output driver and outputs the data to the exterior of the memory device. The controller includes a clock generating circuit that generates internal clock signals based on an external clock signal and a series of paths, with the internal clock signals being selectively supplied to the first to fourth stages to control the stages in a pipeline fashion. Additionally, the switching circuit changes the number of pipeline stages by selectively switching the paths of the clock generating circuit in response to an external control signal to change the operation of the stages.

In one embodiment, the external control signal defines a selected latency for the device, and the paths of the clock generating circuit are switched based on the selected latency. Further, the clock generating circuit generates one internal clock signal from the external clock signal based on the number of stages and the number of data items to be transferred at one time, and generates a plurality of other internal clock signals based on the one internal clock signal via the series of paths.

In the sixth preferred embodiment, the internal clock signals can be selectively supplied to the first to fourth stages to control the stages in a pipeline fashion, and the paths for generating the internal clock signals can be selectively switched in response to a control signal that corresponds to the selected latency to change the operation of the stages. Therefore, it is possible to provide a clock synchronous type semiconductor memory device which can cope with a latency other than the latencies previously taken into consideration to flexibly cope with various latency requirements. Further, if the internal clock signals are generated based on the selected latency, the internal clock signals corresponding to the selected latency can be easily generated. And if one internal clock is generated according to the external clock signal and then a plurality of internal clock signals are generated based on the one internal clock, the internal clock signals corresponding to the latency can be more easily generated.

A seventh preferred embodiment of the present invention provides a memory system having a memory chip, a CPU that supplies a clock signal to the memory chip and controls data readout and data writing with respect to the memory chip, and a bus that allows data to be transferred between the memory chip and the CPU. The memory chip includes control means having a plurality of successive stages connected in series, with each of the stages performing a partial operation necessary for transferring data in synchronism with a control clock. The control means transfers data by sequentially operating the stages and performs pipeline control to allow two or more stages to simultaneously transfer data. Also included is a clock generating circuit that generates internal clock signals based on the clock signal supplied by the CPU, and a clock switching circuit that selectively switches the clock signal supplied by the CPU and the internal clock signals generated by the clock generating circuit to control the operation of each of the stages.

Because the clock signals for controlling the stages can be changed to change the latency by generating the internal clock signals based on the clock supplied by the CPU using the clock generating circuit and selectively switching the clock supplied from the CPU and the internal clock signals using the clock switching circuit, it is possible to construct a memory system that can easily cope with a change of latency without having to change the number of data transfer segments or the control of the individual data transfer stages.

An eighth preferred embodiment of the present invention provides a memory system having a memory chip, a CPU that supplies a clock signal to the memory chip and controls data readout and data writing with respect to the memory chip, and a bus that allows data to be transferred between the memory chip and the CPU. The memory chip includes control means having a plurality of successive stages connected in series, with each of the stages performing a partial operation necessary for transferring data in synchronism with a control clock. The control means transfers data by sequentially operating the stages and performs pipeline control to allow two or more stages to simultaneously transfer data, with each stage transferring one data item at a time or simultaneously transferring two or more data items at a time as a block of data. Also included is a clock generating circuit that generates internal clock signals based on the clock signal supplied by the CPU and a series of paths and supplies the internal clock signals to the control means to control the operation of the stages, and a path switching circuit that selectively switches the paths of the clock generating circuit in response to the control signal supplied by the CPU.

According to the eighth preferred embodiment, the internal clock signals can be generated based on the clock supplied by the CPU using the clock generating circuit, and the clock supplied by the CPU and the internal clock signals can be selectively switched as control clocks for the stages of the system using the clock switching circuit. Therefore, it is possible to construct a memory system that can easily cope with a change of latency without having to change the number of data transfer segments or the control of the individual data transfer stages.

A ninth preferred embodiment of the present invention provides a memory system having a memory chip, a CPU that supplies a clock signal to the memory chip and controls data readout and data writing with respect to the memory chip, and a bus that allows data to be transferred between the memory chip and the CPU. The memory chip includes a first stage having an address generating circuit that fetches a top address of a data burst and generates a sequence of addresses based on the top address, and a column decoder that decodes the address generated by the address generating circuit and generates a selection signal for a sense amplifier, a second stage that latches the selection signal and couples the selected sense amplifier to a data transfer line to transfer data, a third stage including a DQ buffer that senses and latches the data transferred to the data transfer line, and a fourth stage that latches the data from the DQ buffer and outputs the data to the exterior of the chip. Also included is control means including a clock generating circuit for generating internal clock signals based on the clock signal supplied by the CPU, with the clock signal supplied by the CPU and the internal clock signals being selectively supplied to the first to fourth stages to control the stages in a pipeline fashion. A switching circuit changes the number of pipeline stages based on a selected latency by selectively switching the clock signal supplied by the CPU and the internal clock signals to change the operation of the stages.

According to the ninth preferred embodiment, the number of pipeline stages can be switched according to the selected latency by controlling the first to fourth stages in a pipeline fashion using the control circuit and selectively switching the clock supplied by the CPU and the internal clock signals to change the operations of the stages. Therefore, it is possible to provide a memory system which can easily cope with a latency other than the latencies previously taken into consideration to flexibly cope with various latency requirements.

A tenth preferred embodiment of the present invention provides a memory system having a memory chip, a CPU that supplies a clock signal to the memory chip and controls data readout and data writing with respect to the memory chip, and a bus that allows data to be transferred between the memory chip and the CPU. The memory chip includes a first stage having an address generating circuit that fetches a top address of a data burst and generates a sequence of addresses based on the top address and a column decoder that decodes the address generated by the address generating circuit and generates a selection signal for a sense amplifier, a second stage that latches the selection signal and couples the selected sense amplifier to a data transfer line to transfer data, a third stage including a DQ buffer that senses and latches the data transferred to the data transfer line, and a fourth stage that latches the data from the DQ buffer and outputs the data to the exterior of the chip. Also included is control means including a clock generating circuit that generates internal clock signals based on the clock supplied by the CPU and a series of paths, with the internal clock signals being selectively supplied to the first to fourth stages to control the stages in a pipeline fashion. A switching circuit changes the number of pipeline stages based on the control signal supplied by the CPU by selectively switching the paths of the clock generating circuit to change the operation of the stages.

In the tenth preferred embodiment, the internal clock signals can be selectively supplied to the first to fourth stages to control the stages in a pipeline fashion, and the paths for generating the internal clock signals can be selectively switched in response to a control signal supplied by the CPU to change the operation of each of the stages. Therefore, it is possible to provide a memory system which can cope with a latency other than the latencies previously taken into consideration to flexibly cope with various latency requirements.

Some embodiments of the memory system of the present invention also include at least one electronic device that receives data read out from the memory chip and is controlled based on the received data, and a controller that supplies an address to the memory chip via the bus. In these embodiments, the electronic device can be controlled according to data stored in the memory chip under the control of the CPU by supplying data read out from the memory chip to the electronic device via the bus. Further, the address to the memory chip can be supplied not only by the CPU, but also by the controller.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the scope of the present invention.

BRIEF DESCRIPTION OF THE SEVERAL VIEWS OF THE DRAWING

Preferred embodiments of the present invention will be described in detail hereinbelow with reference to the attached drawings.

FIG. 1 is a timing chart illustrating the data transfer stages and the number of pipeline stages in an SDRAM that uses a data transfer system according to a preferred embodiment of the present invention;

FIG. 2 is a block diagram showing the SDRAM described in FIG. 1;

FIG. 3 is a circuit diagram showing the stages of the data transfer path in the SDRAM of FIG. 2;

FIG. 7 is a timing chart illustrating an operation for changing between latencies of "5" and "3" in a device having the stage construction described in FIG. 6;

FIG. 12 is a timing chart illustrating an operation for changing between latencies of "3" and "2" by transferring data one bit at a time;

FIG. 13 is a timing chart illustrating an operation for changing between latencies of "3" and "2" when two-bit data is transferred for each stage in a device having the stage construction described in FIG. 12;

FIG. 14 is a timing chart illustrating another operation for changing between latencies of "3" and "2" when two-bit data is transferred for each stage in a device having the stage construction described in FIG. 12;

FIG. 15 is a timing chart illustrating an operation for transferring data two bits at a time with a latency of "4" in a device having the stage construction described in FIG. 1;

FIG. 16 is a timing chart illustrating an operation for transferring data one bit at a time with a latency of "2";

FIG. 17 is a timing chart illustrating an operation for transferring data two bits at a time with a latency of "2";

FIG. 20 is a block diagram showing a stage controller for generating internal signals to control the data transfer stages using the internal clock generating circuit of FIGS. 19A and 19B;

FIGS. 21A and 21B are block diagrams showing a preferred embodiment of a circuit that is used in generating the clock signals and dividing the frequency thereof;

FIG. 22 is a block diagram showing a timing signal generating circuit for generating an internal clock series based on an external clock signal;

FIG. 25 is a timing chart illustrating the internal clock signals generated by the circuits of FIGS. 22 and 24;

FIG. 26 is a block diagram showing a memory system that uses the SDRAM of the present invention.

DETAILED DESCRIPTION OF THE INVENTION

Figure 4:
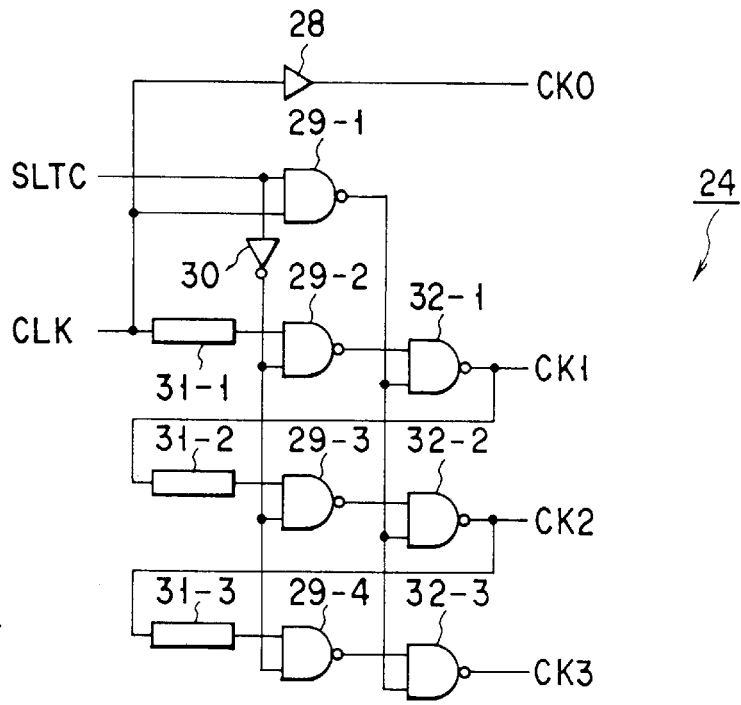
FIG. 4 is a circuit diagram showing a preferred embodiment of the internal clock generating circuit that is provided in the controller of the SDRAM of FIG. 2.

Preferred embodiments of the present invention will be described in detail hereinbelow with reference to the attached drawings.

FIG. 1 is a timing chart illustrating the data transfer stages and the number of pipeline stages for latencies of "4" and "1" in an SDRAM that uses a data transfer system according to a preferred embodiment of the present invention. FIG. 2 is a block diagram of the SDRAM described in FIG. 1, and FIG. 3 is a circuit diagram showing the stages of the data transfer path in the SDRAM of FIG. 2.

As shown in FIG. 2, the SDRAM 11 includes a memory cell array 12, a row address buffer 13, a row decoder 14, a column address buffer 15, an address counter 16, a column decoder 17, latch circuits 18, sense amplifiers 19, a column gate 20, a DQ buffer 21, an output driver 22, a controller 23, DQ lines 25, and RWD lines 26. The controller 23 controls the operation of the other circuits in the SDRAM and includes an internal clock generating circuit 24, which generates internal clock signals CK0 through CK3 from an external clock signal CLK. The internal clock generating circuit 24 generates the internal clock signals CK0 through CK3 based on the state of an external control signal SLTC, which is used to select the latency of the device.

The memory cell array 12 contains memory cells arranged in a matrix form such that the memory cells in each row are connected to a word line WL and the memory cells in each column are connected to a bit line BL. The row address buffer 13 receives a row address signal RAdd, and outputs the row address to the row decoder 14 to select one of the word lines WL (i.e., one of the rows of memory cells). Memory cells in the selected row are coupled to the bit lines BL, and the potentials on the bit lines BL are amplified by the sense amplifiers 19. The column address buffer 15 receives a column address signal CAdd, and outputs the column address to the address counter 16. The address counter 16 is sequentially counted up in response to the first internal clock signal CK0 from the internal clock generating circuit 24 to generate an internal column address.

The internal column address is decoded by the column decoder 17 and the decoded output is supplied to the latch circuits 18. The latch circuits 18 latch the decoded output in response to the second internal clock signal CK1 from the internal clock generating circuit 24, and the output of the latch circuits 18 is supplied to the column gate 20. The column gate 20 selects the output of one of the sense amplifiers 19 based on the output of the latch circuits 18 so that data on the corresponding bit line BL is supplied to the DQ line 25. The DQ buffer 21 is connected to the DQ lines 25 and fetches data from the DQ lines 25 in response to the third internal clock signal CK2. The output of the DQ buffer 21 is supplied to the output driver 22 via the RWD lines 26 in response to the fourth internal clock signal CK3 output from the internal clock generating circuit 24. In this manner, the output driver 22 outputs the data stored in the selected memory cell as an external data output signal Dout.

FIG. 3 shows a portion of the SDRAM of FIG. 2 and, in particular, shows the stages in the data transfer path from address input to data output. In FIG. 3, the gates separating the stages are illustratively represented by clocked inverters that operate to instantaneously transfer data only at the timing of rise of the corresponding clock signal. In other words, each gate is opened to permit data transfer only at the instant of the rise of the corresponding clock signal. To realize a latency of "4", four pipeline stages are necessary to transfer the data one item at a time. Therefore, the data transfer path following determination of the column address is divided into four portions designated as data transfer stages S0, S1, S2, and S3.

The first stage S0 includes the address buffer 15 which fetches a top address of a data burst, the address counter 16 which generates a sequence of addresses based on the top address, and the column decoder 17 which generates a column selection signal CSLi by decoding the address. When both the external clock signal CLK and a signal COM corresponding to an address fetching command are set to the high level, a bit Ai of the column address is supplied to the address buffer 15 and then the address counter 16. The address counter 16 performs its count-up operation in response to the first internal clock signal CK0 to sequentially generate one of the bits intAi of the internal column address. As a result, column addresses for the burst data output of the SDRAM are sequentially generated and then decoded by the column decoder 17.

The second stage S1 includes the latch circuits 18 which latch the column selection signal CSLi from the decoder 17, the memory cell array 12, the sense amplifiers 19, the column gates 20, and the DQ line 25. The latch circuits 18 latch the column selection signal CSLi in response to the second internal clock signal CK1, and the column gates 20 are controlled by the latched column selection signals CSL. Thus, data is transferred from the selected bit line BL to the DQ line 25 via the sense amplifier 19 selected by the column selection signal CSL. The third stage S2 includes the DQ buffer 21, which senses and latches data from the DQ line 25, and the RWD line 26. The DQ buffer 21 latches the data on the DQ line 25 in response to the rise of the third internal clock signal CK2, and outputs the latched data to the RWD line 26. The fourth stage S3 includes the output driver 22 and the data output signal Dout, which is output from the chip 11. The output driver 22 latches the data on the RWD line 26 in response to the rise of the fourth internal clock signal CK3.

With this construction, the data transfer stages S0 through S3 are controlled by the internal clock signals CK0 through CK3 output from the internal clock generating circuit 24, and data is transferred from one stage to the next each time the internal clock signals CK0 through CK3 rise to the high level. With respect to one data item, the data is sequentially transferred through the stages in order (i.e., S0, S1, S2, then S3) and is ultimately output from the fourth stage S3 as the data output signal Dout. The stages perform their respective data transferring operations in each clock cycle, so that the number of pipeline stages is four.

Next, the operation of the SDRAM of FIGS. 2 and 3 is illustratively explained for a case in which the latency is changed between "4" and "1". In FIG. 1, with respect to one data item, the stages through which the data advances during each clock cycle are surrounded by a frame 27. In order to set a sequence of stage controls in correspondence to latencies of "4" and "1", the internal clock generating circuit 24 selectively generates the internal clock signals CK0 through CK3 from the external clock signal CLK based on the selected latency. More specifically, when the latency is "4", each of the internal clock signals CK0 through CK3 is generated at the same timing as the external clock signal CLK, and the data transfer stages S0 through S3 are controlled by the simultaneous internal clock signals CK0 through CK3. (This is equivalent to supplying the external clock signal CLK as each of the internal clock signals CK0 through CK3.) On the other hand, when the latency is "1", the first internal clock signal CK0 is generated at the same timing as the external clock signal CLK, and the other internal clock signals CK1 through CK3 are generated by sequentially delaying the first internal clock signal CK0 such that the cumulative amount of delay is less than one cycle of the external clock signal CLK. (This is equivalent to supplying the external clock signal CLK as the first internal clock signal CK0.) The data transfer stages S0 through S3 are controlled by the sequence of internal clock signals CK0 through CK3, which are sequentially set to the high level.

In the SDRAM of FIGS. 2 and 3, the selection of the latency is accomplished by use of the external control signal SLTC. In particular, when the control signal SLTC for selecting the latency is set to the high level at time t0, a latency of "4" (LTC=4) is selected and the internal clock signals CK0 through CK3 are generated at the same timing as the external clock signal CLK. As a result, each stage S0 through S3 receives data in each cycle so that the four stages S0 through S3 are set in the operative state in all of the cycles. Therefore, four frames 27 overlap with each other in each cycle (except for the initial three cycles in which the first data item is transferred through the first three stages S0 through S2). Accordingly, the control is the same as in a conventional pipeline control system. On the other hand, when the control signal SLTC is set to the low level at time t0, a latency of "1" (LTC=1) is selected, the first internal clock signal CK0 is generated at the same timing as the external clock signal CLK, and the other internal clock signals CK1 through CK3 are generated by sequentially delaying the first internal clock signal CK0. Because the data transfer control operations are sequentially effected, the frames 27 do not overlap with each other. Thus, the number of pipeline stages becomes one (i.e., no pipeline operation is effected).

In the data transfer operation explained above, with respect to one data item, the control of the stages S0 through S3 for data transfer is the same irrespective of the latency. If the latency is decreased, the number of stages that simultaneously transfer data is reduced. Thus, the number of pipeline stages is reduced, and the power associated with the pipeline data transfer is also reduced.

FIG. 4 shows a preferred embodiment of the internal clock generating circuit 24 of the SDRAM of FIGS. 2 and 3. As explained above, the internal clock generating circuit 24 generates the internal clock signals CK0 through CK3 for controlling the data transfer stages S0 through S3 based on the external clock signal CLK. Further, the internal clock signals are selectively generated in accordance with the level of the control signal SLTC to change between latencies of "4" and "1". The internal clock generating circuit 24 is constructed to include a buffer 28, NAND gates 29-1 through 29-4, an inverter 30, delay circuits 31-1 through 31-3, and NAND gates 32-1 through 32-3. The external clock signal CLK is supplied to the input terminal of the buffer 28 and the buffered signal is output as the first internal clock signal CK0. The control signal SLTC is supplied to one input terminal of the NAND gate 29-1, the external clock signal CLK is supplied to the other input terminal thereof, and an output thereof is supplied to one input terminal of each of NAND gates 32-1 through 32-3.

Additionally, the control signal SLTC is supplied to one input terminal of NAND gates 29-2 through 29-4 via the inverter 30. The external clock signal CLK is supplied to the other input terminal of the NAND gate 29-2 via the delay circuit 31-1, and an output thereof is supplied to the other input terminal of the NAND gate 32-1. The second internal clock signal CK1, which is output from the NAND gate 32-1, is supplied to the other input terminal of the NAND gate 29-3 via the delay circuit 31-2, and an output thereof is supplied to the other input terminal of the NAND gate 32-2. Similarly, the third internal clock signal CK2, which is output from the NAND gate 32-2, is supplied to the other input terminal of the NAND gate 29-4 via the delay circuit 31-3, and an output thereof is supplied to the other input terminal of the NAND gate 32-3. The internal clock signals CK0 through CK3, which are respectively output from the buffer 28 and NAND gates 32-1 through 32-3, are supplied to the data transfer stages S0 through S3 to control the operations thereof.

In the clock generating circuit of FIG. 4, if the control signal SLTC is set at the high level, all of the internal clock signals CK0 through CK3 are generated by buffering the external clock signal CLK. In other words, the internal clock signals CK0 through CK3 are clock signals having substantially the same timing as the external clock signal CLK. Therefore, the stages S0 through S3 are simultaneously operated in each cycle to achieve a latency of "4" for the memory device (see FIG. 1). In contrast, if the control signal SLTC is set at the low level, the first internal clock signal CK0 is generated by buffering the external clock signal CLK. Additionally, the second internal clock signal CK1 is generated by delaying the external clock signal CLK by the delay time of delay circuit 31-1, the third internal clock signal CK2 is generated by delaying the second internal clock signal CK1 by the delay time of delay circuit 31-2, and the fourth internal clock signal CK3 is generated by delaying the third internal clock signal CK2 by the delay time of delay circuit 31-3. The delay times of the delay circuits 31-1 through 31-3 are set to be substantially equivalent to one cycle of the external clock signal CLK that is used for a latency of "4". Thus, the third and fourth internal clock signals CK2 and CK3 are sequentially generated based on the second internal clock signal CK1. Accordingly, the stages S0 through S3 are sequentially operated to achieve a latency of "1".

Accordingly, in the memory device described above, it is possible to easily cope with a change in the latency without changing the control of the individual data transfer segments or the number of data transfer stages. Further, the latency of the memory device can be changed so that various latency requirements can be flexibly satisfied.

Figure 5:
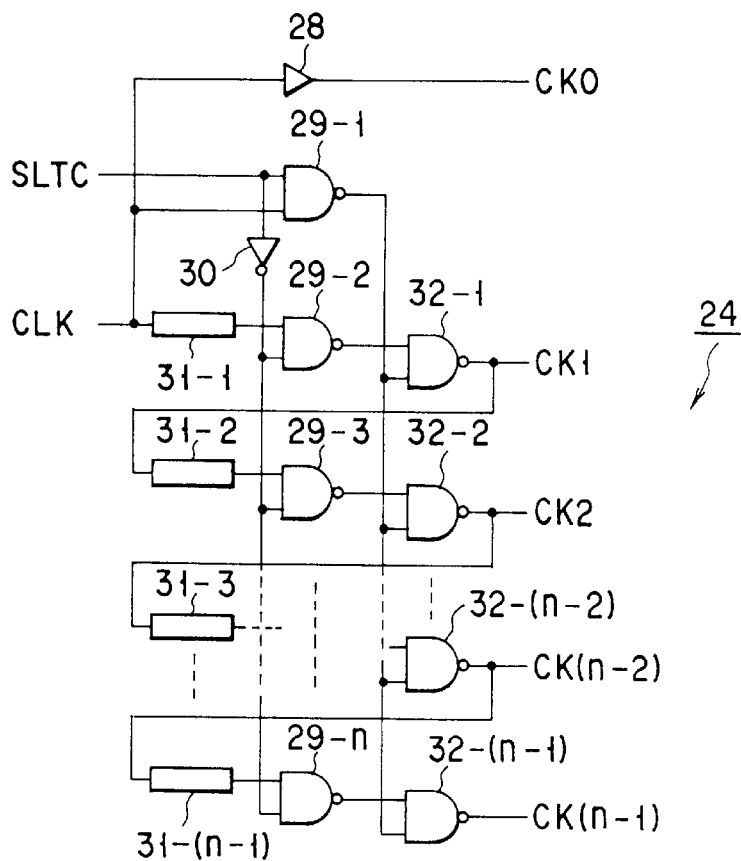
FIG. 5 is a circuit diagram showing an embodiment of the internal clock generating circuit used for changing between latencies of "n" and "1"

In the description above, a case in which the latency is changed between "4" and "1" is illustratively explained. However, in accordance with the present invention, various changes in the latency can be coped with by modifying the method of generating the internal clock signals from the external clock signal. For example, an internal clock generating circuit for changing the latency to "1" when the latency is "n" (e.g., "4" or more) is shown in FIG. 5. As shown, the number of stages of NAND gates 29-1 through 29-n and 32-1 through 32-(n-1) and delay circuits 31-1 through 31-(n-1) is set according to the higher latency of "n" so that the internal clock signals CK0 through CK(n-1) can be properly generated.

Figure 6:
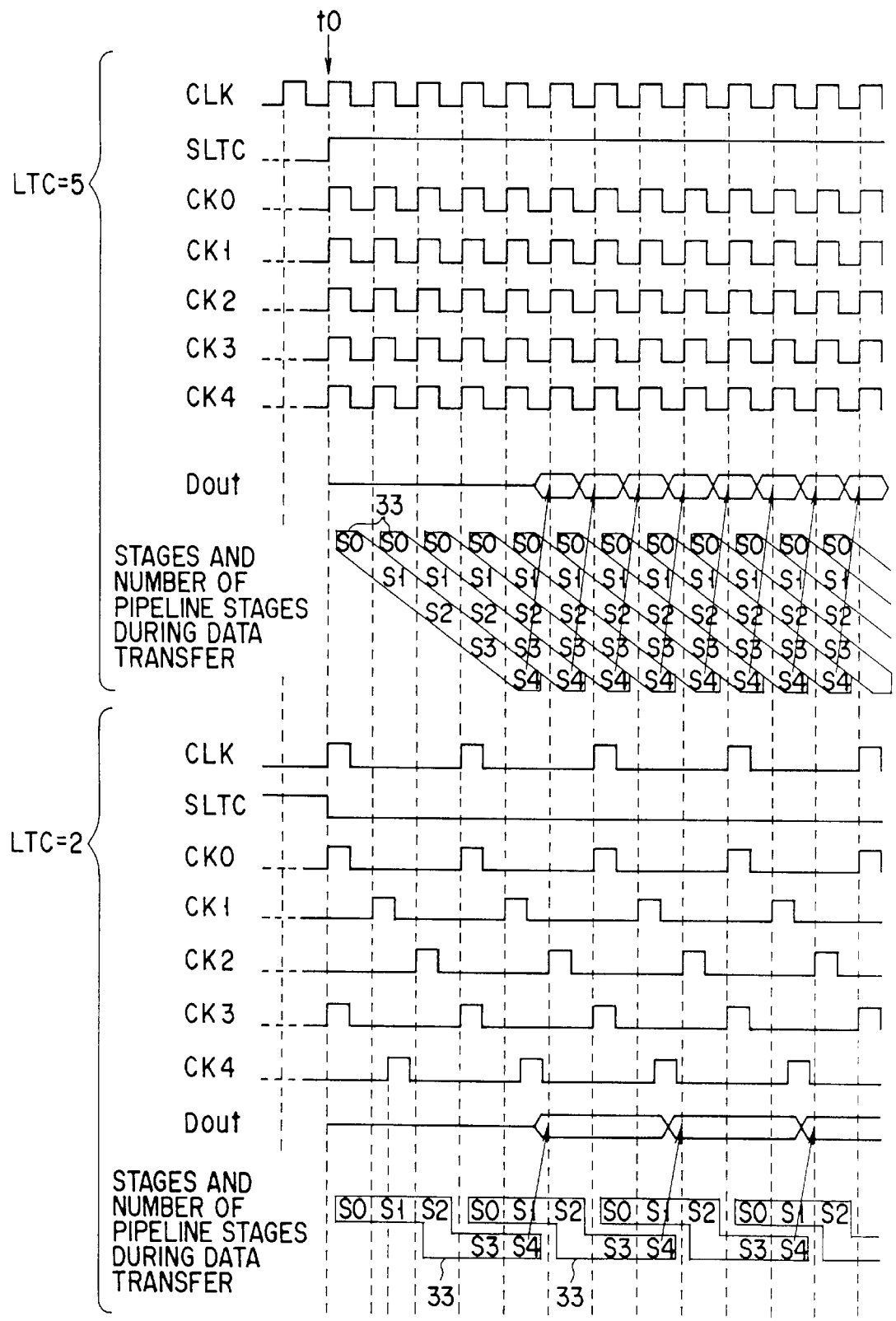
FIG. 6 is a timing chart illustrating an operation for changing between latencies of "5" and "2"

FIG. 6 is a timing chart illustrating a case in which the latency is changed between "5" and "2". Because the higher latency is "5", five data transfer stages S0 through S4 are necessary to transfer the data one item at a time. The stages in each group are controlled by five internal clock signals CK0 through CK4, which are generated based on the external clock signal CLK, and the five data transfer stages are divided into two groups for the latency of "2". The five data transfer stages may be divided into two pipeline stages by dividing the stages as: one stage and four stages, two stages and three stages, three stages and two stages, or four stages and one stage. The division to be used is determined based on the construction of the data transfer stages, and should be chosen so as to make the pipeline control as efficient as possible. For example, because the minimum external clock period is typically dependent on the group having the larger number of stages, a large difference in the number of stages (e.g., one stage and four stages) is disadvantageous for high-speed data transfer. In FIG. 6, the data transfer stages S0 through S4 are illustratively divided into a group of three stages and a group of two stages.

In the memory device of FIG. 6, if the control signal SLTC for changing the latency is set at the high level, a latency of "5" is selected and the internal clock signals CK0 through CK4 are generated at the same timings as the external clock signal CLK. Therefore, all of the stages S0 through S4 are simultaneously operated in each cycle so five frames 33 overlap in each cycle (after the initial four cycles).

On the other hand, if the control signal SLTC is set at the low level, a latency of "2" is selected, the first three stages S0 through S2 (i.e., the first pipeline stage) are controlled by one series of internal clock signals CK0, CK1, CK2, and the last two stages S3 and S4 (i.e., the second pipeline stage) are controlled by another series of internal clock signals CK3 and CK4.

More specifically, the first and fourth internal clock signals CK0 and CK3 are generated at the same timing as the external clock signal CLK. Then, the second and third internal clock signals CK1 and CK2 are generated by sequentially delaying the first internal clock signal CK0, and the fifth internal clock signal CK4 is generated by delaying the fourth internal clock signal CK3. (It may be advantageous to generate the fifth internal clock signal CK4 separately from the second and third internal clock signals CK1 and CK2 because the last two data transfer stages operate within the same time period as the first three stages.) Thus, for a latency of "2", two groups of stages are simultaneously operated, so two frames 33 overlap in each cycle (after the initial three cycles) and the number of pipeline stages becomes two.

FIG. 7 is a timing chart illustrating a case in which the latency is changed between "5" and "3" in a device having the same stage construction as the device of FIG. 6. The five data transfer stages may be divided into three pipeline stages by dividing into three groups having: one stage, one stage, and three stages; one stage, two stages, and two stages; one stage, three stages, and one stage; two stages, one stage, and two stages; two stages, two stages, and one stage; or three stages, one stage, and one stage. In FIG. 7, the data transfer stages S0 through S4 are illustratively divided into a group of two stages, another group of two stages, and a group of one stage.

If the control signal SLTC for changing the latency is set at the high level, a latency of "5" is selected and, as in FIG. 6, the internal clock signals CK0 through CK4 are generated at the same timing as the external clock signal CLK. Therefore, all of the stages S0 through S4 are simultaneously operated in each cycle so 5 frames overlap in each cycle (after the initial four cycles). In contrast, if the control signal SLTC is set to the low level, a latency of "3" is selected, the first two stages S0 and S1 are controlled by one series of internal clock signals CK0 and CK1, the next two stages S2 and S3 are controlled by another series of internal clock signals CK2 and CK3, and the last stage S4 is controlled by yet another internal clock signal CK4. In particular, the first, third, and fifth internal clock signals CK0, CK2, and CK4 are generated at the same timing as the external clock signal CLK. Then, the second and fourth internal clock signals CK1 and CK3 are generated by delaying other internal clock signals. Thus, three groups of stages are simultaneously operated, so three frames overlap in each cycle (after the initial four cycles) and the number of pipeline stages becomes three.

Figure 8A:
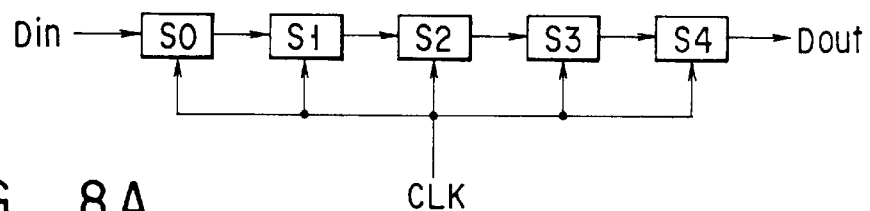
FIGS. 8A through 8C are block diagrams showing the relation between the internal clock signals and the data transfer stages when the latencies are changed in the manner described in FIGS. 6 and 7.
Figure 8B:
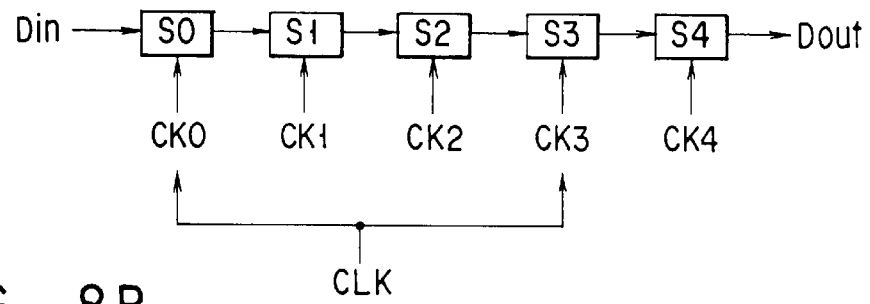
Figure 8C:
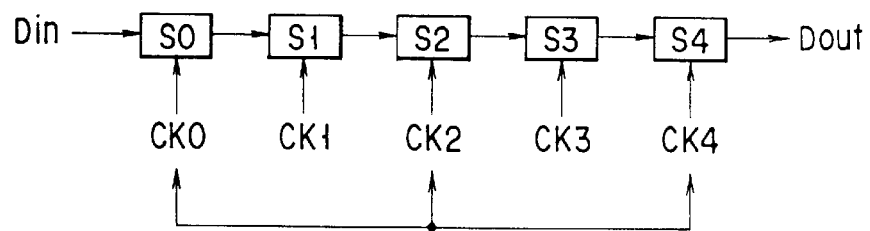

FIGS. 8A through 8C show the relation between the internal clock signals and the data transfer stages when the latencies are changed as described above for FIGS. 6 and 7. As explained above, each data transfer stage is one of operational segments obtained when the sequence of operations for outputting data is divided into multiple segments and data is output by sequentially operating the operational segments. The data transfer stages can be grouped to form pipeline stages in any possible manner, but it is advantageous to divide the stages so that each group can complete its operations within the same time period.

FIGS. 8A, 8B, and 8C show the relation for a latency of "5", a latency of "2", and a latency of "3", respectively (see FIGS. 6 and 7). In these FIGS., input data Din is input to the first stage S0, is sequentially transferred through the intermediate three stages S1, S2, and S3, and is output from the last stage S4 as output data Dout. In each case, the data transfer stages that receive an internal clock signal at substantially the same timing as the external clock signal are connected to the external clock signal CLK by arrows. (As explained above, the internal clock signals are generated based on the external clock signal CLK.)

Figure 9:
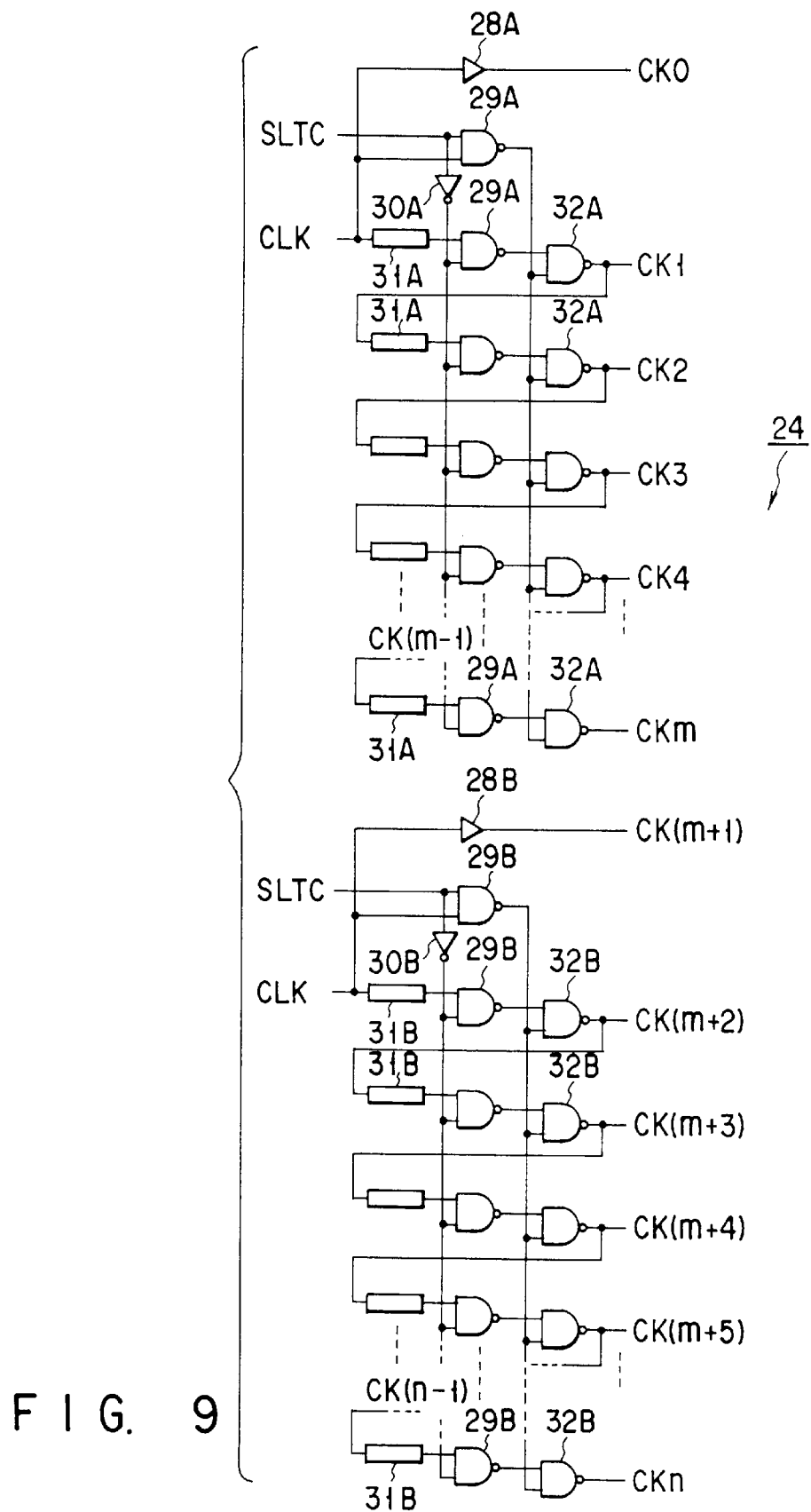
FIG. 9 is a circuit diagram showing an embodiment of the internal clock generating circuit used for controlling the stages as shown in FIGS. 8A through 8C.

FIG. 9 shows an embodiment of the internal clock generating circuit that can control the data transfer stages in the manner shown in FIGS. 8A through 8C. The internal clock generating circuit includes buffers 28A and 28B, NAND gates 29A, 29B, 32A, and 32B, inverters 30A and 30B, and delay circuits 31A and 31B. The clock generating circuit of FIG. 9 has the same basic construction and operation as the clock generating circuits of FIGS. 4 and 5. However, the internal clock signals CK0 through CKn are separately generated as two groups, one having internal clock signals CK0 through CKm and another having internal clock signals CK(m+1) through CKn. with this circuit, the internal clock signals CK0 and CK(m+1) have substantially the same timing as the external clock signal CLK.

To change between latencies of "5" and "2" (see FIG. 6), "m" is set to two and "n" is set to four. Accordingly, when the control signal SLTC is set at the high level, all of the internal clock signals CK0 through CK4 having substantially the same timing as the external clock signal CLK. And, when the control signal SLTC is set at the low level, a first sequence of internal clock signals CK0 through CKm are sequentially generated and, at the same time, a second sequence of internal clock signals CK(m+1) through CKn are sequentially generated. The data transfer stages S0 through S4 are controlled by the corresponding internal clock signals CK0 through CKm and CK(m+1) through CKn (i.e., internal clock signals CK0 through CK2 and internal clock signals CK3 and CK4).

To change between latencies of "5" and "3" (see FIG. 7), the internal clock generating circuit is constructed to individually generate three groups of internal clock signals based on the external clock signal CLK. Thus, in addition to the circuit for generating a first group of internal clock signals CK0 through CKm and the circuit for generating the second group of internal clock signals CK(m+1) through CKn (FIG. 9), a circuit for generating a third group of internal clock signals is required. The circuit for generating the third group of internal clock signals has the same construction as the other two circuits, and generates internal clock signals CK(n+1) through CKo. Similarly, to handle a latency of "4", an additional generating circuit is provided to generate another group of internal clock signals in the same manner.

Figure 10:
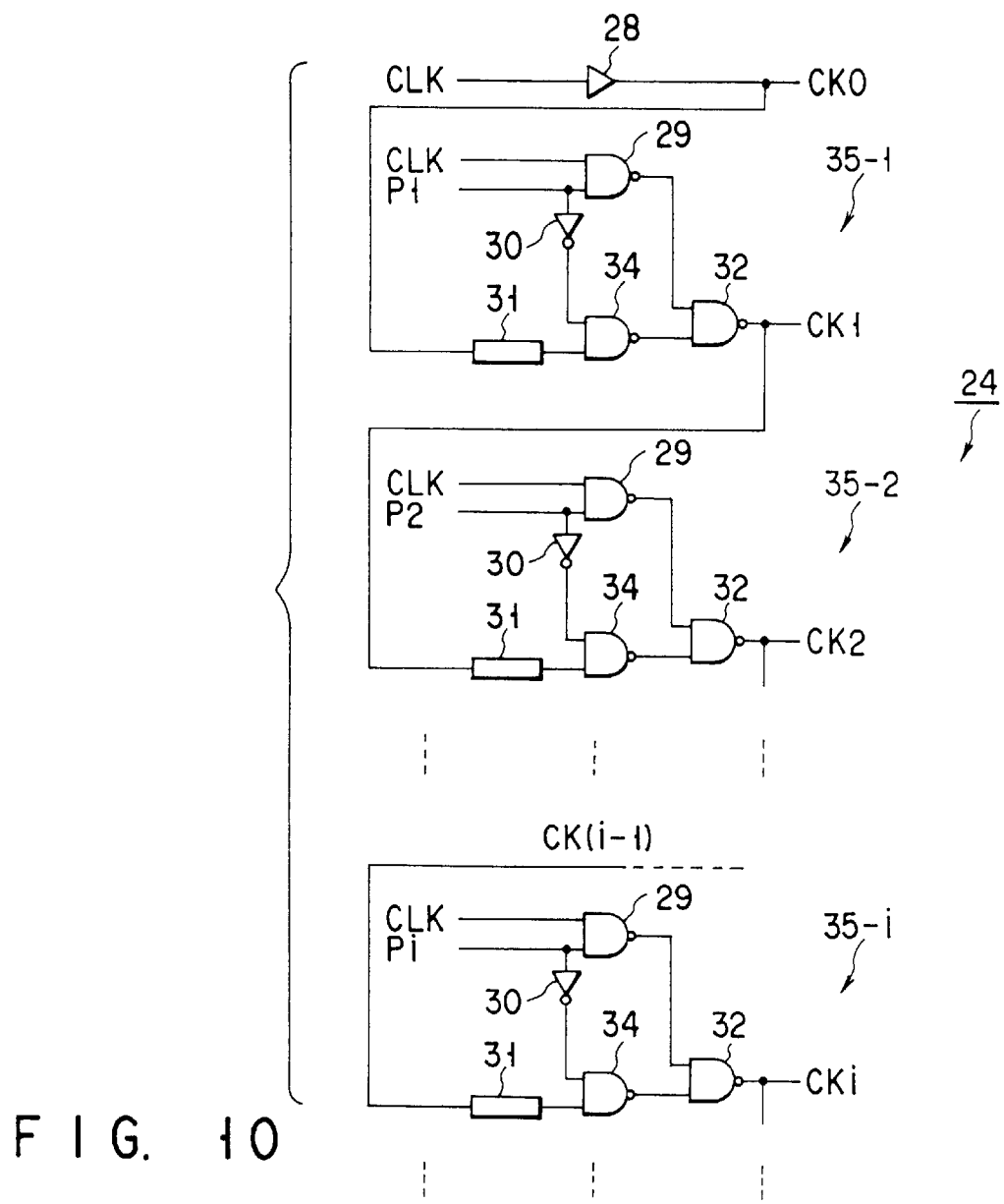
FIG. 10 is a circuit diagram showing another embodiment of the internal clock generating circuit that can flexibly cope with various latency requirements.

In the embodiments of the clock generating circuit described above, the latency can only be changed between two fixed values based on the level of a control signal SLTC. However, in further embodiments, the latency can be flexibly changed between three or more values based on external control signals. A preferred embodiment of the clock generating circuit for flexibly coping with multiple latency requirements is shown in FIG. 10. With this circuit, the positions of the internal clock signals that are generated so as to have substantially the same timing as the external clock signal can be freely adjusted using external control signals. In particular, the first internal clock signal CK0 is generated by passing the external clock signal CLK through a buffer 28, so the internal clock signal CK0 has substantially the same timing as the external clock signal CLK. Additionally, circuit blocks 35-1 through 35-i are provided that each include NAND gates 29, 32, and 34, an inverter 30, and a delay circuit 31.

In each circuit block, one input terminal of the first NAND gate 29 is supplied with the external clock signal CLK, and the other input terminal thereof receives a control signal P for changing the latency. One input terminal of the second NAND gate 34 receives the control signal P via the inverter 30, and the other input terminal thereof receives the clock generated by the previous circuit block via the delay circuit 31. The input terminals of the third NAND gate 32 receive the outputs of the first and second NAND gates 29 and 34, and the output thereof is the internal clock signal generated by the circuit block. In this manner, the first internal clock signal CK0 is supplied to one input terminal of the second NAND gate 34 in the first circuit block 35-1 via the delay circuit 31, and the second internal clock signal CK1 is output from the third NAND gate 32. Similarly, the second internal clock signal CK1 is supplied to one input terminal of the second NAND gate in the second circuit block 35-2 via the delay circuit, and the third internal clock signal CK2 is output from the third NAND gate 32. Thus, the individual internal clock signals are sequentially output from the circuit blocks and each is supplied to the next circuit block.

Furthermore, with respect to circuit block 35-i, if the control signal Pi for changing the latencies is set to the high level, the circuit block's internal clock signal CKi is generated at substantially the same timing as the external clock signal CLK. On the other hand, if the control signal Pi is set to the low level, the circuit block's internal clock signal CKi is generated by delaying the internal clock signal CK(i-1) generated by the previous circuit block. Thus, if a control signal Pi is set to the high level, the corresponding circuit block's internal clock signal CKi is generated at the same timing as the external clock signal CLK. As a result, it becomes possible to flexibly change the latency using the control signals Pi.

For example, to generate the same internal clock signals as the circuit of FIG. 9, the first internal clock signal CK0 (as in FIG. 10) is generated by buffering the external clock signal CLK, and "n−1" circuit blocks 35 are provided to generate the other "n−1" internal clock signals CK1 through CKn. Additionally, the control signal P(m+1) for stage (m+1) (with m<n) is set to the high level, and the other control signals are set to the low level. As another example, to change between latencies of "4" and "1" (as in FIG. 1), the first internal clock signal CK0 is generated by buffering the external clock signal, three circuit blocks are provided to generate three more internal clock signals CK1 through CK3, control signals P1 through P3 are set to the high level for a latency of "4", and control signals P1 through P3 are set to the low level for a latency of "1".

As yet another example, to change between latencies of "5" and "2" as in FIG. 6, the first internal clock signal CK0 is generated by buffering the external clock signal, and four circuit blocks are provided to generate four more internal clock signals CK1 through CK4. Additionally, control signals P1 through P4 are all set to the high level for a latency of "5", while control signal P3 is set to the high level and control signals P1, P2, and P4 are set to the low level for a latency of "2". As still another example, to change between latencies of "5" and "3" as in FIG. 7, the first internal clock signal CK0 is generated by buffering the external clock signal, four stages of circuit blocks are provided to generate four more internal clock signals CK1 through CK4. Additionally, control signals P1 through P4 are all set to the high level for a latency of "5", while control signals P2 and P4 are set to the high level and control signals P1 and P3 are set to the low level for a latency of "3".

Figure 11:
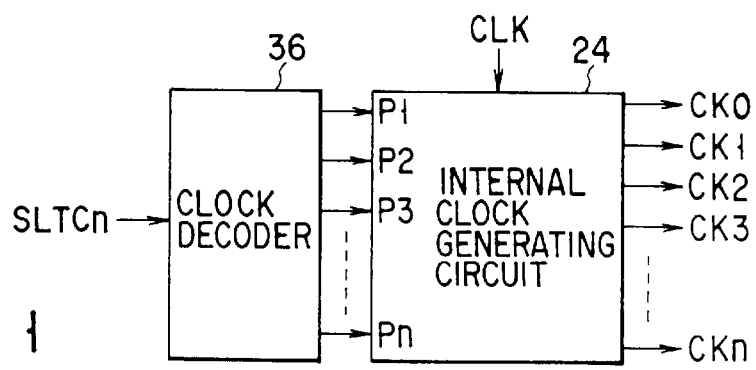
FIG. 11 is a block diagram showing a clock generating system that can flexibly cope with various latency requirements by using the internal clock generating circuit of FIG. 10.

FIG. 11 is a block diagram of a clock generating system that includes the internal clock generating circuit of FIG. 10. This clock generating system is illustratively constructed to control "n+1" data transfer stages. As shown, a clock decoder 36 decodes an external control signal SLTCn, which indicates the selected latency for the device, and generates control signals P1 through Pn, which are supplied to the internal clock generating circuit 24. The internal clock generating circuit 24 is of the type shown in FIG. 10 and generates internal clock signals CK0 through CKn based on the external clock signal CLK and control signals P1 through Pn.

In the embodiments described above, the data is transferred one bit at a time. However, in further embodiments, the data is collectively transferred as one unit. For example, an embodiment in which two bits of data are transferred in each data transfer stage will now be explained.

First, an operation for changing between latencies of "3" and "2" is explained. For comparison, FIG. 12 illustrates an operation for changing between latencies of "3" and "2" when data is transferred one bit at a time. At least three data transfer stages S0, S1, and S2 are required, and, for a latency of "3" (LTC=3), each of the three data transfer stages receives data in each cycle. Thus, all three stages are simultaneously operated in each cycle so the number of pipeline stages becomes three, as shown by the frames 37. For a latency of "2" (LTC=2), the data transfer stages are divided into a group of two stages S0 and S1 and a group of one stage S2. Additionally, the first and third internal clock signals CK0 and CK2 are generated by buffering the external clock signal CLK, while the second internal clock signal CK1 is generated by delaying the first internal clock signal CK0 by a preset amount. By controlling the stages S0 through S2 with the corresponding internal clock signals CK0 through CK2, two groups of stages are simultaneously operated so that the number of pipeline stages becomes two, as shown by the frames 37. Furthermore, because data is transferred one bit at a time, the last stage S2 must be operated in every external clock cycle in order to output data every external clock cycle.

FIGS. 13 and 14 are timing charts illustrating operations for changing between latencies of "3" and "2" when two-bit data is transferred in each data transfer stage in a device having three data transfer stages. Because two bits of data are simultaneously transferred, data from the last stage S2 requires two external clock cycles to be output. Thus, the last stage S2 only needs to be operated every other external clock cycle in order to output data every external clock cycle. When a command to output data from a new address is input in a cycle corresponding to two clock cycles (e.g., at time t1), the device operates with a 2n cycle. On the other hand, when a command to output data from a new address is input in a cycle other than two clock cycles (i.e., at time t2), the device operates with a non-2n cycle.

As shown in FIG. 13, for a latency of "3" (LTC=3), three data transfer stages S0 through S2 are divided into a group of two stages S0 and S1 and a group of one stage S2. The first and last stages S0 and S2 are simultaneously operated every other cycle, so all of the stages are operated every two cycles. Thus, the number of pipeline stages becomes two, as shown by the frames. To control the data transfer stages, all of the internal clock signals CK0 and CK2 are generated every other external clock cycle at the same timing as the external clock signal CLK, with the first and third internal clock signals CK0 and CK2 being generated for one external clock cycle and the second internal clock signal CK1 being generated for the next external clock cycle.

For the 2n cycle, in which a new address command is input only at every second external clock cycle from time t0, the relation between the stages S0 through S2 and the internal clock signals CK0 through CK2 that control the stages remains unchanged regardless of whether a new address is presented every two external clock cycles. That is, when a new address is presented, the new address is simply made the start address for the next data transfer without requiring any change in the data transfer flow. With the 2n cycle, no change is required because two-bit data blocks have to be transferred at a time and a new address can only be input every second clock cycle. Of course, the division between the data blocks of two bits must be changed depending on the start address, but the data transfer flow of the stages remains unchanged.

In contrast, if the cycle in which a new address command is input is deviated from the 2n cycle (i.e., for the non-2n cycle), the generation of the internal clock signals and the data transfer flow of the stages are temporarily disturbed when the new address is presented. In particular, while a two-bit data block is transferred to the last stage S2, only one of the data bits in the last stage S2 is output and the other bit is discarded. Both bits from the last data transfer stage cannot be output because the new address was presented in a non-2n cycle. While the cycles of the external clock signal in which the two groups of stages operate become successive over four cycles, the number of pipeline stages is two for the 2n cycle and the non-2n cycle, as shown by the frames in FIG. 13.

In order to properly generate the internal clock signals for both the 2n cycle and the non-2n cycle, the first internal clock signal CK0 is generated in each cycle in which the new address command is input, and is thereafter generated every other clock cycle until a next new address command is input. Additionally, the second and third internal clock signals CK1 and CK2 are generated by sequentially delaying the first internal clock signal CK0 such that generation of the second and third internal clock signals CK1 and CK2 is not interrupted regardless of the timing of the new address command. Therefore, data is always output every clock cycle after the initial latency for both the 2n cycle and the non-2n cycle.

As shown in FIG. 14, for a latency of "2" (LTC=2), the data transfer stages S0 through S2 are divided into a group of two stages S0 and S1 and a group of one stage S2, just as in FIG. 12. Additionally, the first and third internal clock signals CK0 and CK2 are generated from the external clock signal CLK, and the second internal clock signal CK1 is generated by delaying the first internal clock signal CK0 by a preset amount. By controlling the stages S0 through S2 with the corresponding internal clock signals CK0 through CK2, the data transfer flow proceeds as follows. For the 2n cycle, each of the data transfer stages is only operated in every other external clock cycle because two-bit data blocks are transferred at a time and a new address can only be input every second clock cycle. Thus, the number of pipeline stages becomes one, as shown by the frames 38.

On the other hand, for the non-2n cycle, a new sequence of internal clock signals CK0 through CK2 must be started at the external clock cycle in which the new address command is input. As a result, the first and last stages S0 and S2 are simultaneously operated in the cycle in which the new address command is input, and the number of pipeline stages temporarily changes to two. If the first internal clock signal CK0 is generated every other clock cycle and in each clock cycle in which the new address command is input, and the second and third internal clock signals CK1 and CK2 are generated by sequentially delaying the first internal clock signal, the number of pipeline stages is automatically changed between one and two for proper data transfer.

Next, an operation for changing between latencies of "4" and "2" when two bits of data are simultaneously transferred is explained. FIG. 15 illustrates the operation when two bits of data are simultaneously transferred in a device having the same stage construction as the device of FIG. 1. For a latency of "4", each data transfer stage is operated every other external clock cycle. The first internal clock signal CK0 is generated every other external clock cycle, and the second through fourth internal clock signals CK1 through CK3 are generated by successively delaying the first internal clock signal CK0. Thus, the number of pipeline stages becomes two, as shown by the frames.

FIGS. 16 and 17 illustrate the operation for a latency of "2" in a device having the same stage construction as the device of FIG. 1. In FIG. 16, each stage transfers one bit of data at a time, so the last stage S3 must operate in each external clock cycle. Therefore, one group of two stages S0 and S1 and another group of two stages S2 and S3 must be simultaneously operated every external clock cycle. If the stages are controlled by the internal clock generating circuit of FIG. 10, the internal clock signals CK0 through CK3 are generated by the buffer 28 and three circuit blocks 35-1 through 35-3, with the control signals set as P1="0", P2="1" and P3="0". Because two data transfer stages are simultaneously operated in each cycle, the number of pipeline stages is two, as shown by the frames.

In FIG. 17, two bits of data are transferred in each data transfer stage and the latency is "2". The stages are divided into the same two groups as in FIG. 14, but two bits of data are simultaneously transferred. Therefore, the last stage only needs to be operated every other clock cycle in order to output data every clock cycle, so each of the internal clock signals CK0 through CK3 is generated every other clock cycle. For the 2n cycle, the number of pipeline stages is always one because two-bit data blocks have to be transferred at a time and a new address can only be input every second clock cycle. On the other hand, for the non-2n cycle, a new address command is input in a non-2n cycle so the two groups of stages must be simultaneously operated during the clock cycle in which the new address command is input. Thus, the number of pipeline stages temporarily changes to two, as shown by the frames. The generation of the sequence of internal clock signals every other clock cycle and when the new address command is input in a non-2n cycle is explained above, so another description thereof is omitted.

In the embodiments described above, the latency is changed for a device in which two bits of data are simultaneously transferred. However, in further embodiments, the latency is changed for devices in which three or more bits of data are simultaneously transferred. In these further embodiments, instead of operating the last stage once every two external clock cycles as in two-bit data transfer, the last stage is operated once every "t" external clock cycles (t=number of simultaneously-transferred bits).

Figure 18A:
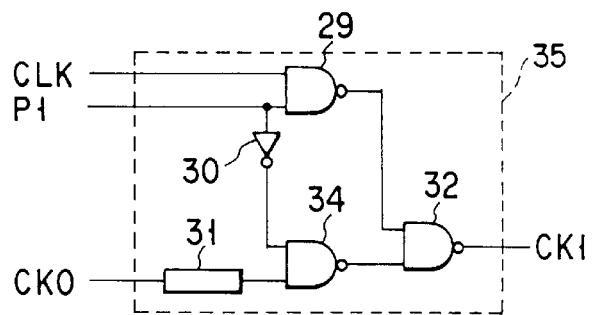
FIGS. 18A and 18B are block diagrams showing a portion of the circuit of FIG. 10 that has been extracted as a unit to form a circuit block.

The generation of the internal clock signals in a device that simultaneously transfers two bits of data will now be explained in more detail. FIGS. 18A and 10B show the circuit block 35 of FIG. 10 extracted as one unit. As explained above, the circuit block 35 receives the external clock signal CLK, an internal clock signal CK0, and a control signal P1, and outputs the next internal clock signal CK1. If the control signal P1 is set to the low level, the output clock signal is obtained by delaying the internal clock signal CK0 using the delay circuit 31. If the control signal P1 is set to the high level, the output clock signal is obtained by buffering the external clock signal CLK through two NAND gates 29 and 32.

Figure 18B:
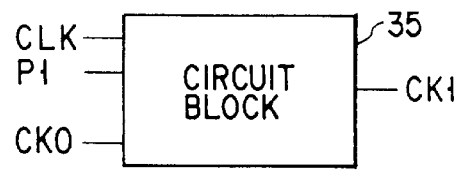
Figure 19A:
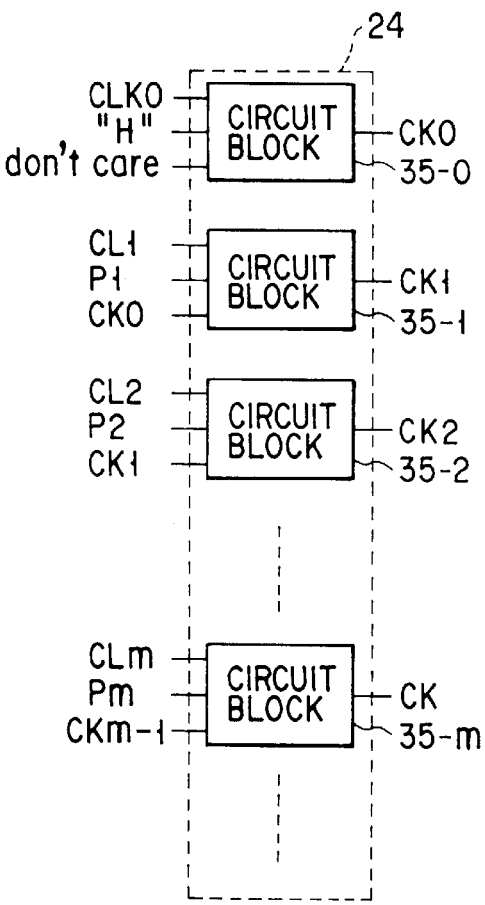
FIGS. 19A and 19B are block diagrams showing an embodiment of the internal clock generating circuit that is constructed using the circuit blocks of FIGS. 18A and 18B.
Figure 19B:
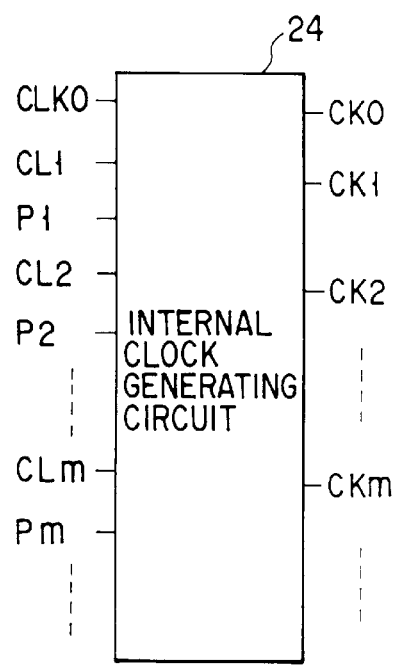

FIGS. 19A and 19B show an internal clock generating circuit constructed using the circuit blocks of FIGS. 18A and 18B. The relation between the input clock signals, the control signals, and the output clock signals in this circuit can be understood from FIGS. 18A through 19B. In the clock generating circuit of FIG. 10, the external clock signal CLK is supplied to the external clock input terminal of every circuit blocks 35. In contrast, in FIGS. 19A and 19B, each of the circuit blocks 35 has an input terminal that receives a separate clock signal CLp (p=0 through m). Additionally, the first internal clock signal CK0 is not generated using the buffer 28, but is generated in the first circuit block 35-0. Because the internal clock signal CK0 is always generated at the same timing as the external clock signal CLK, the first control signal P0 is fixed at the high level and the level of the internal clock input terminal does not affect the output clock signal CK0.

FIG. 20 shows a stage control system constructed using the internal clock generating circuit of FIGS. 19A and 19B. In order to handle both cases in which data is transferred one bit at a time and cases in which data is transferred multiple bits at a time, the clock decoder 36 receives both a control signal SLTCn indicating the selected latency and the basic external clock signals CLK0 through CLKm. The basic external clock signals CLK0 through CLKm are external lock signals generated every (number of simultaneously-transferred bits) external clock signal CLK cycles. In particular, the second basic external clock signal CLK1 is generated in a clock cycle next to a clock generated by use of the first basic external clock signal CLK0, and the third basic external clock signal CLK2 is generated in a clock cycle next to a clock generated by use of the second basic external clock signal CLK1. In the same manner, each of the other basic external clock signals is sequentially generated in a cycle next to a clock which is generated in the preceding-stage circuit. The clock decoder 36 decodes the control signal SLTCn and the basic external clock signals CLK0 through CLKm so as to generate input clock signals CL1 through CLm and control signals P1 through Pm. The internal clock generating circuit 24 receives these signals and generates the internal clock signals CK0 through CKm, which correspond in number to the number of data transfer stages.

The manner in which the above-described clock signals are generated will now be explained using one possible circuit construction as an example. FIGS. 21A and 21B show a basic circuit used to generate clock signals and divide the frequency thereof, with FIG. 21A showing a schematic diagram of the circuit and FIG. 21B showing the circuit in block diagram form. The basic circuit includes a first clocked inverter 40 controlled by the external clock signal CLK, a second clocked inverter 41 controlled by an inverted external clock signal/CLK, a NOR gate 42, three inverters 43, 44, and 46, and a NAND gate 45, as shown in FIG. 21A. An input signal IN is supplied to the first clocked inverter 40, the output of the first clocked inverter is supplied to the second clocked inverter 41, the first inverter 43 and the NOR gate 42. The output of the first inverter 43 is supplied to the second inverter 44, and the output of the second inverter 44 is fed back to the output terminal of the first clocked inverter 40. The inverted external clock signal/CLK is also supplied to the NOR gate 42, and a latch output X is output from the NOR gate. Further, the output of the second clocked inverter 41 is output as an output signal OUT of the circuit, and is also supplied to the NAND gate 45. A reset signal/R is also supplied to the NAND gate 45, and the output thereof is fed back to the output terminal of the second clocked inverter 41 via the third inverter 46.

During operation, the input signal IN is fetched and latched in response to the rise of the external clock signal CLK, and is output as the output signal OUT in response to the fall of the external clock signal CLK. The latch output X outputs high when the external clock signal rises and the input signal IN is latched, and is reset to low when the external clock signal falls. Further, the output signal OUT is forced to low when the reset signal/R is low. This basic circuit is referred to as an FT block 47 and its circuit block representation is shown in FIG. 21B.

FIG. 22 shows a timing signal generating circuit constructed using the FT blocks of FIGS. 21A and 21B. The circuit generates signals specifying which external clock cycles are to be used to sequentially generating the internal clock signals that drive the data transfer stages after the input of a command COM. For example, in the circuit of FIG. 22, the number of stages is three, so the circuit can be used in operating a device in the manner shown in FIG. 13 or 14. More specifically, the timing signal generating circuit includes three FT blocks 47-1 through 47-3, a NAND gate 48, a P-channel MOS ("PMOS") transistor 49, and an N-channel MOS ("NMOS") transistor 50.

A command signal COM and an external clock signal CLK are supplied to the NAND gate 48, and the output thereof is supplied to the gate of the PMOS transistor 49. The source of the PMOS transistor 49 is connected to a power source Vcc, and the drain thereof is connected to both the drain of the NMOS transistor 50 and the input of the first FT block 47-1. An inverted external clock signal/CLK is supplied to the gate of the NMOS transistor 50, and the source thereof is connected to another power source Vss (e.g., ground). Additionally, the output of the first FT block 47-1 is connected to the input of the second FT block 47-2, and the output of the second FT block 47-2 is connected to the input of the third FT block 47-3. The output of the third FT block 47-3 is not used. The external clock signal CLK and the inverted external clock signal/CLK are also supplied to the FT blocks 47-1 through 47-3, whose latch outputs X are respectively designated as output signals CLSW0 through CLSW2. Further, the power source Vcc is connected to the reset input/R of each FT block 47-1 through 47-3 so that all of the reset signals are fixed at the high level (i.e., the output signals OUT are never forced low).

Figure 23:
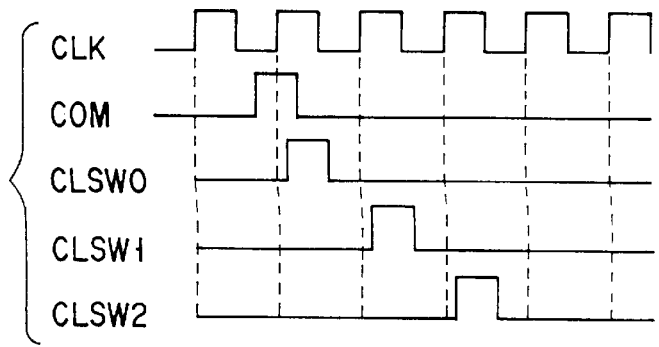
FIG. 23 is a timing chart illustrating the external clock signal and the output signals of the timing signal generating circuit.

FIG. 23 shows the relation between the command signal COM, the external clock signal CLK, and the output signals CLSW0 through CLSW2 in the circuit of FIG. 22. In the external clock cycle in which a command is input, the command signal COM rises to the high level so the output signal of the NAND gate 48 goes to the low level when the external clock signal CLK rises. As a result, the PMOS transistor 49 is turned ON and the NMOS transistor 50 is turned OFF, so the input signal IN to the first FT block 47-1 is set to the high level. This, in turn, causes the output signal CLSW0 of the first FT block 47-1 to be set to the high level. Then, when the external clock signal CLK falls, the PHOS transistor 49 is turned OFF and the NMOS transistor 50 is turned ON, so the input signal IN of the first FT block 47-1 is set to the low level.

This, in turn, causes the output signal CLSW0 to also be set to the low level. At this time, the output signal OUT of the first FT block 47-1 is supplied to the second FT block 47-2 as the input signal IN thereof. At this point, the input of the first FT block 47-1 is held at the low level, the input of the second FT block 47-2 is set to the high level. Thus, when the external clock signal CLK rises, the output signal CLSW1 of the second FT block is set to the high level. Likewise, when the external clock signal CLK rises the next time, the output signal CLSW2 from the third FT block 47-2 is set to the high level. Because the power source Vcc is connected to the reset input/R of each FT block 47-1 through 47-3, all of the reset signals are fixed at the high level and the output signals OUT are always operable (i.e., never forced low). After the clock cycle in which the output signal CLSW2 from the third FT block 47-2 is set to the high level, all three output signals CLSW0 through CLSW2 will be set at the low level until another command is input. In other words, the sequence of output signals CLSW0 through CLSW2 is only output from the circuit once for each time a command is input.

Figure 24:
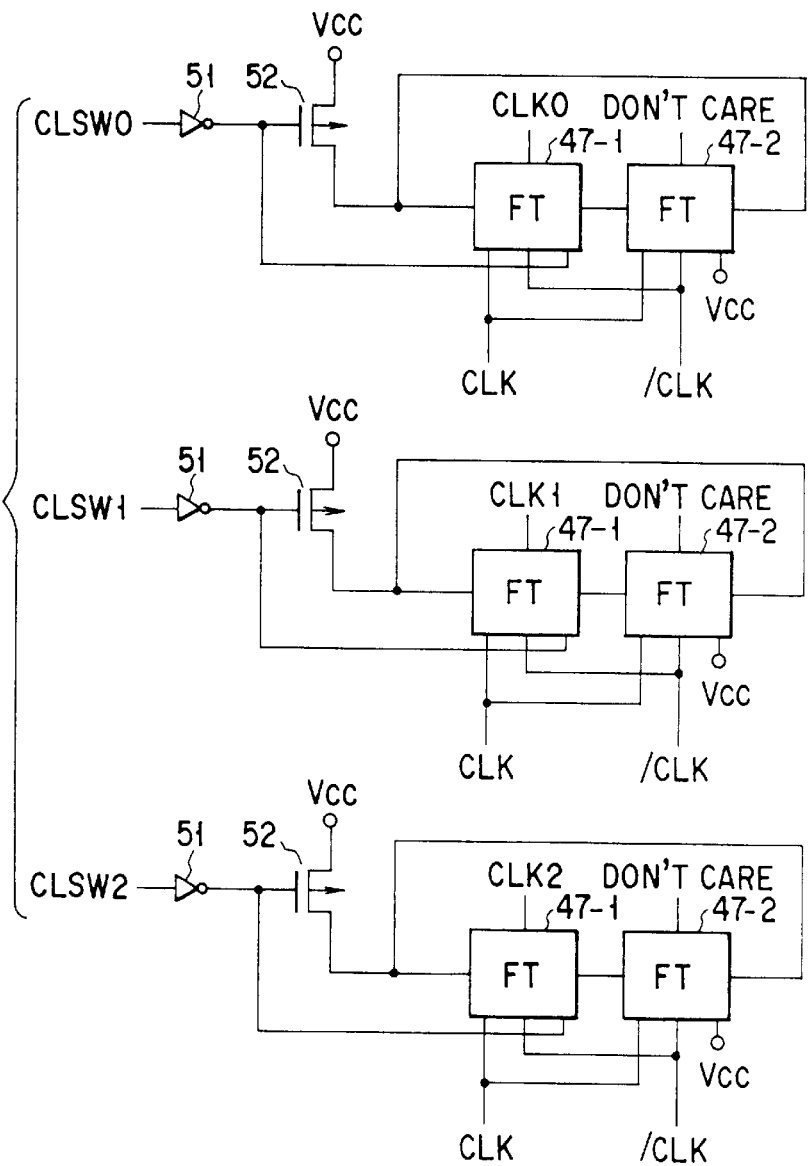
FIG. 24 is a circuit diagram showing an embodiment of the clock generating circuit for generating an internal clock in every other cycle.
Figure 27:
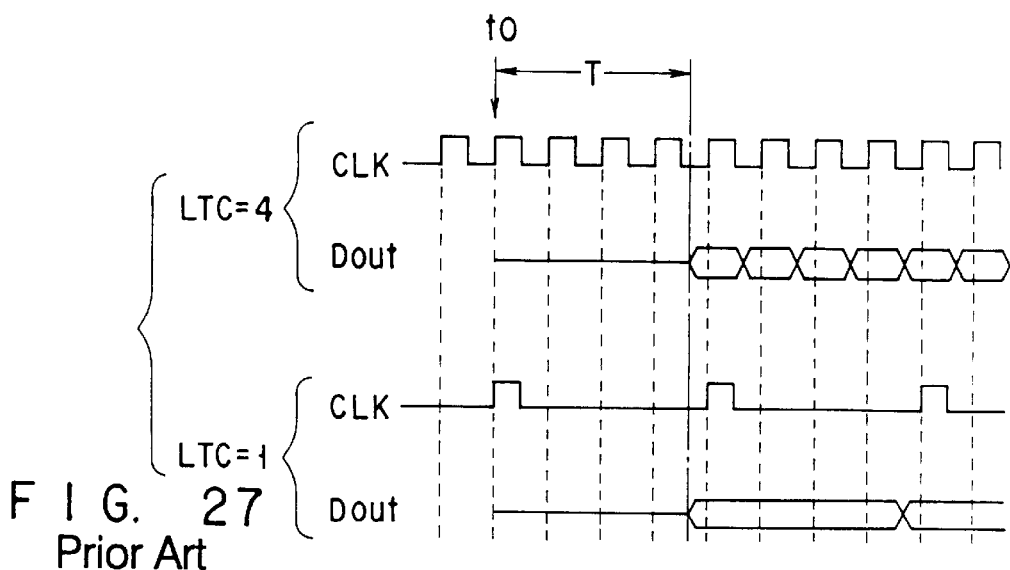
FIG. 27 is a timing chart illustrating the relation between the clock signal and data output for latencies of "4" and "1" in a conventional synchronous memory device.

The internal clock signals CLK0 through CLK2 that control the stages are generated in synchronism with the external clock signal CLK based on the output signals CLSW0 through CLSW2. The number of cycles of the external clock signal that corresponds to the interval at which the internal clock signals CLK0 through CLK2 are generated is determined based on the number of data bits that are simultaneously transferred. For example, FIG. 24 shows an internal clock generating circuit for a device in which data is transferred two bits at a time. That is, the internal clock signals CLK0 through CLK2 are generated every other cycle. As shown in FIG. 24, each circuit that generates one of the internal clock signals CLK0 through CLK2 includes two FT blocks 47-1 and 47-2 connected in a ring form such that a pulse-shaped input signal is transmitted along the ring in synchronism with the external clock signal CLK. The output signals CLSW0 through CLSW2 are used to adjust the phases of the pulses. The generating circuits all have the same construction, so an explanation of one of the generating circuits will be given by way of example.

The generating circuit that generates the first internal clock signal CLK0 includes an inverter 51, PMOS transistor 52, and two FT blocks 47-1 and 47-2. The output signal CLSW0 is supplied to the input of the inverter 51, and the output thereof is supplied to both the gate of the PMOS transistor 52 and the reset input of the first FT block 47-1 (as the reset signal/R). The source of the PMOS transistor 52 is connected to the power source Vcc, and the drain thereof is connected to the input of the first FT block 47-1. The output of the first FT block 47-1 is connected to the input of the second FT block 47-2, and the output of the second FT block 47-2 is connected to the input of the first FT block 47-1. The external clock signal CLK and the inverted external clock signal/CLK are supplied to both FT blocks 47-1 and 47-2, and the latch output X of the first FT block 47-1 is the first internal clock signal CLK0. Additionally, the power source Vcc is connected to the reset input/R of the second FT block 47-2 so that the reset signal is fixed at the high level.

The output signal CLSW0 is set to the high level for the same timing as the external clock signal CLK during the first clock cycle after the command is input. Because the output signal CLSW0 is supplied to the gate of the PMOS transistor 52 via the inverter 51, the PMOS transistor 52 is turned ON. As a result, the input signal IN of the first FT block 47-1 is set to the high level and the first internal clock signal CLK0 rises to the high level. The inverted output signal CLSW0 is supplied to the reset input/R of the first FT block 47-1, so the output signal OUT, which is supplied to the second FT block 47-2 as the input signal IN, is set to the low level. When the external clock signal CLK falls to the low level, the PMOS transistor 52 is turned OFF so the first internal clock signal CLK0 also falls to the low level.

Next, after the external clock signal CLK rises and then falls, the output signal OUT of the second FT block 47-2 is set to the high level. Then, at the following rise of the external clock signal CLK, the first internal clock signal CLK0 is again output from the first FT block 47-1. In this manner, the first internal clock signal CLK0 is generated in synchronism with the external clock signal CLK every other cycle of the external clock signal. Further, the second and third internal clock signals CLK1 and CLK2 are generated in the same manner, with only the cycles of the external clock signal that cause generation of the internal clock signals being different.

FIG. 25 is a timing chart illustrating the internal clock signals generated by the circuits shown in FIGS. 22 and 24. For this example, assume that a command is input at external clock cycles "0", "7", and "10". For each cycle in which the command is input, when the external clock signal CLK rises, the command signal COM is at the high level so the output signals CLSW0 through CLSW2 are generated by the circuit of FIG. 22 using that external clock cycle as a starting point. Additionally, the first internal clock signal CLK0 is generated every other cycle after the cycle of the external clock signal CLK in which the output signal CLSW0 rises. Likewise, the second internal clock signal CLK1 is generated every other cycle after the cycle of the external clock signal CLK in which the output signal CLSW1 rises, and the third internal clock signal CLK2 is generated every other cycle after the cycle of the external clock signal CLK in which the output signal CLSW2 rises.

As illustrated in FIG. 25, even when a command is input in a cycle other than a cycle in which the first internal clock signal CLK0 is to be generated (e.g., cycles "7" and "10"), the entire sequence of internal clock signals CLK0 through CLK2 is sequentially generated beginning from the cycle in which the command is input. Therefore, the number of pipeline stages is automatically changed so that data is properly output, even if data is transferred through the stages multiple bits at a time.

In the timing signal generating circuit of FIG. 22, a case in which three output signals CLSW0 through CLSW2 are generated is illustratively shown. The general circuit design can be applied to other cases by setting the number of generated output signals equal to the number of data transfer stages in the device. In particular, only the number of FT blocks 47 needs to be changed. Similarly, the internal clock generating circuit of FIG. 24 illustrates a case in which the internal clock signals are generated every two cycles because data is transferred two bits at a time. To transfer data three or more bits at a time, the internal clock signals must be generated at cycle intervals equal to the number of data bits to be transferred at a time. Thus, the internal clock generating circuit is constructed by connecting a number of FT blocks 47 in ring form equal to the number of data bits in order to generate as many internal clock signals as there are data transfer stages at the proper intervals.

Next, the manner in which the clock decoder of FIG. 20 supplies the internal clock signals and the control signals to the internal clock generating circuit according to the selected latency is explained. First, for the case illustrated in the timing chart of FIG. 12, the number of stages is three, so "m" in the circuit of FIG. 20 is set to two (i.e., the internal clock signals are CLK0 through CLK2). When a latency of "3" is selected by the control signal SLTCn, the clock decoder 36 supplies the internal clock signals CLK0 through CLK2 as the input clock signals CL0 through CL2 to the internal clock generating circuit 24, and the control signals are set as P0="1", P1="1", and P2="1". As a result, the internal clock signals CLK0 through CLK2 are respectively used as the internal clock signals CK0 through CK2 to control the corresponding stages.

Next, for the case illustrated in the timing chart of FIG. 14, there is the same stage construction and a latency of "2" is selected by the control signal SLTCn. Thus, the clock decoder 36 supplies the internal clock signals CLK0 and CLK1 as the input clock signals CL0 and CL2 to the internal clock generating circuit 24, and the control signals are set as P0="1", P0="0", and P2="1". With this setting, the internal clock signals CK0 and CK1 are generated based on the internal clock signal CLK0 and the internal clock signal CK2 is generated based on the internal clock signal CLK1, so as to achieve a latency of "2" as shown in FIG. 14.

For the case illustrated in the timing chart of FIG. 15, the number of stages is 4, so "m" in the circuit of FIG. 20 is set to three (i.e., the internal clock signals are CLK0 through CLK3). When a latency of "4" is selected by the control signal SLTCn, the clock decoder 36 supplies the basic external clock signals CLK0 through CLK3 as input clock signals CL0 through CL3 to the internal clock generating circuit 24, and the control signals are set as P0="1", P1="1", P2="1", and P3="1". Thus, the internal clock signals CLK0 through CLK3 are respectively used as the internal clock signals CK0 through CK3 to control the corresponding stages. Additionally, for the case illustrated in the timing chart of FIG. 17, there is the same stage construction and a latency of "2" is selected by the control signal SLTCn. Thus, the clock decoder 36 supplies the basic external clock signals CLK0 and CLK1 as the input clock signals CL0 and CL2 to the internal clock generating circuit 24, and the control signals are set as P0="1", P1="0", P2="1", and P3="0". With this setting, the internal clock signals CK0 and CK1 are generated based on the basic external clock signal CLK0, and the internal clock signals CK2 and CK3 are generated based on the basic external clock signal CLK1, so as to achieve a latency of "2" as shown in FIG. 17.

According to the data transfer system and data transfer method for pipeline control as described above, proper pipeline control for a selected latency can be realized without changing the number of data transfer stages by changing the timings of the internal clock signals. Additionally, the optimum latency for the period of an external clock can be selected and pipeline control corresponding to that latency can be realized without changing the number of data transfer stages. Further, if two or more data bits are simultaneously transferred, internal clock signals of a number equal to the number of stages are generated in a period corresponding to the number of simultaneously-transferred data bits, and internal clock signals for controlling the stages according to a selected latency can be generated based on the internal clock signals. Therefore, a new address command can be input at any time with respect to the external clock cycle, so there is a high degree of freedom in the data transfer control. Also, the data transfer speed can be enhanced and the power consumption lowered by simultaneously transferring multiple bits of data.

FIG. 26 is a block diagram of a memory system that includes an SDRAM according to the present invention. A memory chip (i.e., SDRAM) 100 is constructed according to an embodiment of the present invention as explained above. The memory chip 100 is connected to a CPU 102, a controller 103, and various electronic devices (e.g., CRT, keyboard, and printer) 104 via a bus (e.g., address bus, command bus, and data bus) 101. A clock signal CLK is output from the CPU 102 and supplied to the memory chip 100, the controller 103, and if required, to the various electronic devices 104. The memory chip 100 also receives a command and control signal (e.g., a control signal SLTC for selecting the latency) from the CPU 102 via the bus 101, and a top address (e.g., row address signal RAdd, and column address signal CAdd) of a data burst from the controller 103. As a result, the memory chip 100 transfers data (Dout) to the CPU 102. Further, data read out from the memory chip 100 under the control of the CPU and controller is selectively supplied to the various electronic devices 104 that require data. Data from the various electronic devices 104 can also be written to the memory chip 100 via the bus 101 under the control of the CPU and controller.

In the memory system of FIG. 26, the address is supplied from the controller to the memory chip. However, in further embodiments, the address can be supplied to the memory chip by the CPU or the various electronic devices.

In the embodiments described above, an "external" signal refers not only to a signal directly supplied from outside of the chip, but also to a signal generated inside the chip by buffering a signal supplied from outside of the chip.

Accordingly, the present invention provides a clock synchronous semiconductor memory device that can easily cope with a latency other than latencies previously taken into consideration so that various latency requirements can be flexibly satisfied. Further, a pipeline-type data transfer system and data transfer method in which the latency can be changed without changing the number of data transfer segments or the control of the individual segments is provided. A memory system using the clock synchronous semiconductor memory device is also provided.

While there has been illustrated and described what are presently considered to be the preferred embodiments of the present invention, it will be understood by those in the art that various other modifications may be made, and equivalents may be substituted, without departing from the true scope of the invention. Additionally, many modifications may be made to adapt a particular situation to the teachings of the present invention without departing from the central inventive concept described herein. Therefore, it is intended that the present invention not be limited to the particular embodiments disclosed, but that the invention include all embodiments falling within the scope of the appended claims.

What is claimed is:

1. A semiconductor device comprising:

an internal circuit; and a clock signal switching unit group having M clock signal switching units, said M clock signal switching units being connected in series, and an output clock signal from a clock signal switching unit of a preceding stage being input to a clock signal switching unit of a succeeding stage, m first clock signals and n control signals being input to said clock signal switching unit group (M is not less than m, and M is not less than n), each of said M clock signal switching units, to which one of said m first clock signals, and an output clock signal from a preceding stage are input, selecting one of said m first clock signals and a signal obtained by delaying said output clock signal from said preceding stage, based on said n control signals, and outputting said selected one of said m first clock signals and said signal as an output clock signal, and said output clock signal controlling said internal circuit.

2. A semiconductor device according to claim 1, wherein said m first clock signals are externally input to said semiconductor device.

3. A semiconductor device according to claim 1, wherein said internal circuit transfers data by sequentially operating stages and performs pipeline control to allow two or more stages to simultaneously transfer said data.

4. A semiconductor device according to claim 3, wherein said n control signals switch a latency of data transfer of said internal circuit.

5. A semiconductor device according to claim 1, further comprising a clock decoder to which a plurality of second clock signals and a command signal are input, for producing said m first clock signals and said n control signals.

6. A semiconductor device according to claim 5, wherein said plurality of second clock signals are selectively input to said clock decoder at every fixed cycle.

7. A semiconductor device according to claim 5, wherein said M clock signal switching units are connected in series, and an output clock signal output from a clock signal switching unit of a preceding stage is input to a clock signal switching unit of a succeeding stage.

8. A semiconductor device according to claim 5, wherein said plurality of second clock signals are externally input to said semiconductor device.

9. A semiconductor device according to claim 6, wherein said plurality of second clock signals are externally input to said semiconductor device.

10. A semiconductor device according to claim 5, wherein said internal circuit transfers data by sequentially operating stages and performs pipeline control to allow two or more stages to simultaneously transfer said data.

11. A semiconductor device according to claim 10, wherein said n control signals switch a latency of data transfer of said internal circuit.

12. A semiconductor device according to claim 11, wherein said command signal determines said latency of said data transfer of said internal circuit.

13. A semiconductor device comprising:
an internal circuit; and
a clock signal switching unit group having a plurality of clock signal switching units, said plurality of clock signal switching units being connected in series, and an output clock signal from a clock signal switching unit of a preceding stage being input to a clock signal switching unit of a succeeding stage, each of said plurality of clock signal switching units, to which a first clock signal, a control signal, and an output clock signal from a preceding stage are input, selecting one of said first clock signal and a signal obtained by delaying said output clock signal from said preceding stage, based on said control signal, and outputting said selected one of said first clock signal and said signal as an output clock signal, and said output clock signal controlling said internal circuit.

14. A semiconductor device according to claim 13, wherein said first clock signal is externally input to said semiconductor device.

15. A semiconductor device according to claim 13, wherein said internal circuit transfers data by sequentially operating stages and performs pipeline control to allow two or more stages to simultaneously transfer said data.

16. A semiconductor device according to claim 15, wherein said control signal switches a latency of data transfer of said internal circuit.

17. A semiconductor device according to claim 13, further comprising a clock decoder to which a plurality of second clock signals and command signal are input, for producing said first clock signal and said control signal.

18. A semiconductor device according to claim 17, wherein said plurality of second clock signals are selectively input to said clock decoder at every fixed cycle.

19. A semiconductor device according to claim 18, wherein said plurality of second clock signals are externally input to said semiconductor device.

20. A semiconductor device according to claim 17, wherein said plurality of clock signal switching units are connected in series, and an output clock signal output from a clock signal switching unit of a preceding stage is input to a clock signal switching unit of a succeeding stage.

21. A semiconductor device according to claim 17, wherein said plurality of second clock signals are externally input to said semiconductor device.

22. A semiconductor device according to claim 17, wherein said internal circuit transfers data by sequentially operating stages and performs pipeline control to allow two or more stages to simultaneously transfer said data.

23. A semiconductor device according to claim 22, wherein said control signal switches a latency of data transfer of said internal circuit.

24. A semiconductor device according to claim 23, wherein said command signal determines said latency of said data transfer of said internal circuit.

* * * * *